United States Patent
Hayashi

(10) Patent No.: US 7,434,179 B2
(45) Date of Patent: Oct. 7, 2008

(54) DESIGN AND SIMULATION METHODS FOR ELECTROSTATIC PROTECTION CIRCUITS

(75) Inventor: Hirokazu Hayashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 235 days.

(21) Appl. No.: 11/284,138

(22) Filed: Nov. 22, 2005

(65) Prior Publication Data

US 2006/0194382 A1      Aug. 31, 2006

(30) Foreign Application Priority Data

Nov. 26, 2004   (JP)  ............................. 2004-341745

(51) Int. Cl.
  *G06F 17/50*  (2006.01)
(52) U.S. Cl. .......................................... 716/2; 703/146
(58) Field of Classification Search ................ 716/2, 716/4–5, 18; 703/13–14

See application file for complete search history.

(56) References Cited

U.S. PATENT DOCUMENTS

2005/0065762 A1 *   3/2005   Hayashi ........................ 703/14

FOREIGN PATENT DOCUMENTS

| JP | 2001339052 A | * 12/2001 |
| JP | 2004-79952 | 3/2004 |

OTHER PUBLICATIONS

M.P.J. Mergens et al.; "High Holding Current SCRs (HHI-SCR) for ESD Protection and Latch-up Immune IC Operation" EOS/ESD Symp., 1A.3, 2002.

* cited by examiner

*Primary Examiner*—Stacy A Whitmore
(74) *Attorney, Agent, or Firm*—Studebaker & Brackett PC; Donald R. Studebaker

(57) ABSTRACT

A physical analysis (S2) of the elements used in an ESD protection circuit is performed; parameters of the elements that have a comparatively large effect on ESD protection characteristics are extracted as key parameters (S4); and a mixed-mode device-circuit simulation of the ESD protection circuit is performed, using the key parameters, to optimize the key parameters (S5). This can shorten the time required for designing an ESD circuit.

6 Claims, 22 Drawing Sheets

DESIGN AND SIMULATION METHODS FOR ELECTROSTATIC PROTECTION CIRCUITS

BACKGROUND OF THE INVENTION

1. Field of the Invention

The present invention relates to a method of designing an ESD protection circuit, in particular an ESD protection circuit for protecting semiconductor elements, semiconductor logic elements, and so on, and in particular to a method of determining its circuit configuration and the parameters of its circuit elements. The present invention also relates to a simulation method used in designing an ESD protection circuit.

2. Description of the Related Art

An increasing number of semiconductor devices have ESD protection circuits to protect their semiconductor memory elements, semiconductor logic circuits, and so on from ESD (electrostatic discharge). An example of a circuit used for ESD protection is shown in "High Holding Current SCRs (HHI-SCR) for Power ESD Protection and Latch-up Immune IC Operation" (EOS/ESD Symp., 1A. 3, 2002) by M. P. J. Mergens, C. C. Russ, K. G. Verhaege, J. Armer, P. C. Jozwiak, and R. Mohn.

The design of an ESD protection circuit is an iterated process in which immunity is tested through simulation, the design of the ESD protection circuit is altered according to the result, and the circuit with the altered design is simulated again. Performing simulations can reduce the number of prototypes, and shorten the time from start of development to finished product.

One example of a conventional simulation method is disclosed in Japanese Patent Application Publication No. 2004-79952. The simulation method described in Japanese Patent Application Publication No. 2004-79952 circuit-simulates the snapback characteristic of an electrostatic discharge protection element configured with a MOSFET in an equivalent circuit that uses a gate terminal to which a gate voltage is input and a bipolar transistor, and represents impact ionization with three current sources.

An accurate simulation accordingly requires the use of many parameters, so the simulation itself is time-consuming, leading to the problem that designing the ESD circuit is time-consuming. Performing a simulation with fewer parameters is less accurate, requiring an increased number of iterations of the evaluation of simulation faults, redesign of the circuit, and further simulation, leading again to the problem that designing the ESD circuit is time-consuming.

SUMMARY OF THE INVENTION

An object of the present invention is accordingly to reduce the time required to design ESD protection circuits.

The present invention provides a method of designing an ESD protection circuit by:

performing a physical analysis of the elements used in the ESD protection circuit and extracting from the parameters of the elements those that have a comparatively large impact on the ESD protection characteristic as key parameters; and performing a mixed-mode device-circuit simulation of the ESD protection circuit, using the key parameters, to optimize the key parameters.

In a method of simulating a circuit under simulation having MOSFETs connected in multiple stages, the invention also provides a simulation method that:

replaces a circuit section of the circuit under simulation, including a first MOSFET having a first main electrode connected to a first node and a second main electrode connected to a second node and circuit elements connected to the input side of the first MOSFET, with an equivalent circuit including a second MOSFET, a resistor with a first end connected to the first main electrode of the second MOSFET and a second end connected to the control electrode of the second MOSFET, and a capacitor with a first electrode connected to the control electrode of the second MOSFET and a second electrode connected to the second main electrode of the second MOSFET;

selects values of the resistor and the capacitor so that the values and variation patterns of current flowing through the second MOSFET, current flowing through the resistor, voltage applied to the control electrode of the second MOSFET, and voltage at the first end of the resistor when a surge voltage is applied to the first main electrode of the second MOSFET, are substantially identical to values and variation patterns of voltages and currents in corresponding parts of said circuit section of the circuit under simulation; and uses the equivalent circuit having the resistor and capacitor with the values thus selected to perform a simulation of the circuit under simulation.

This invention can shorten the time from development of a semiconductor device to finished product.

It can also shorten the time required for simulation.

DETAILED DESCRIPTION OF THE INVENTION

Embodiments of the invention will now be described with reference to the drawings.

First Embodiment

Figure 1:
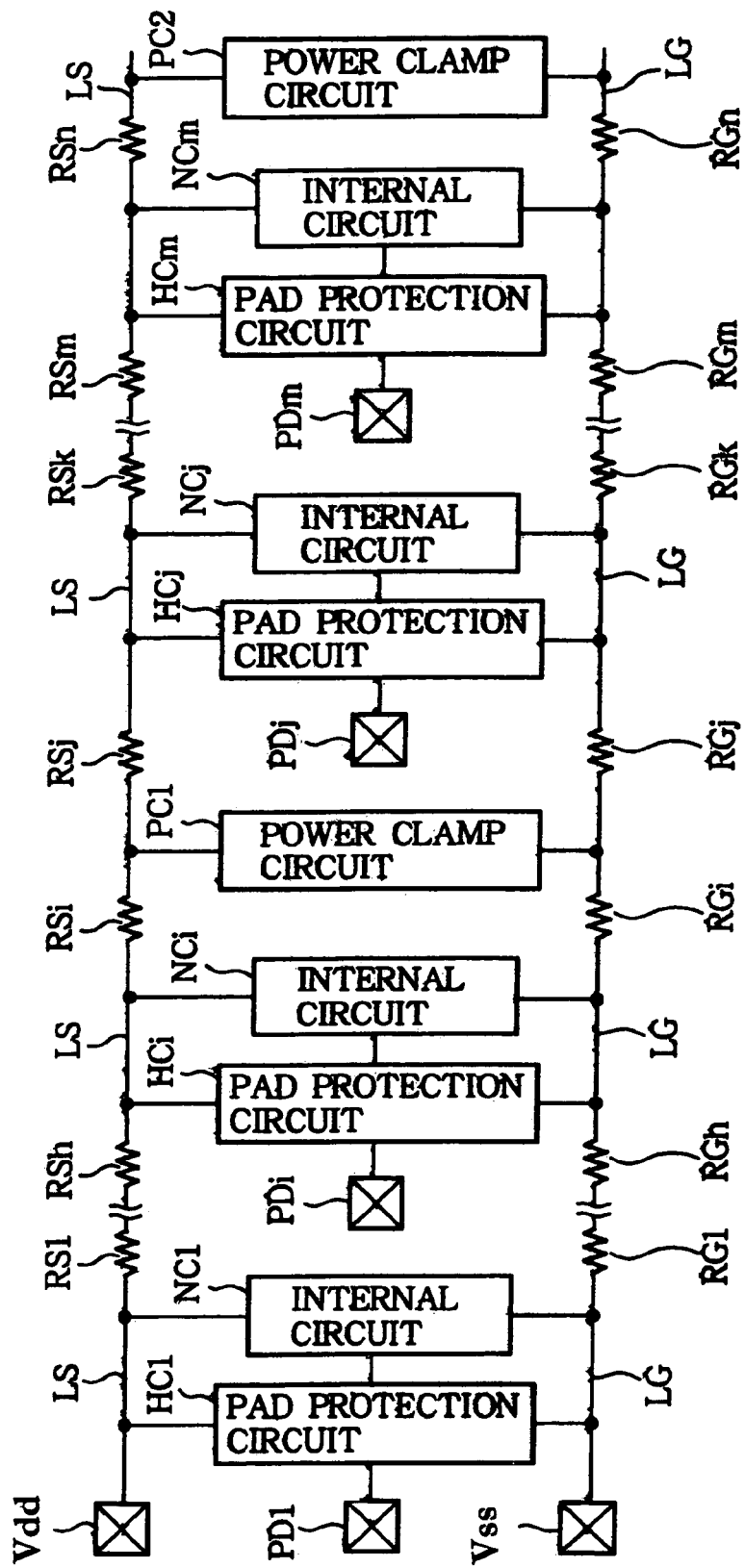
FIG. 1 is schematic circuit diagram showing an example of a semiconductor integrated circuit having ESD protection circuits.

FIG. 1 shows an example of a semiconductor integrated circuit having ESD protection circuits.

As shown, this semiconductor integrated circuit comprises a plurality of signal pads PD1 to PDm for external signal connections; a power line pad Vdd; a ground line pad Vss; a power line LS and a ground line LG connected, respectively, to the power line pad Vdd and ground line pad Vss; a plurality of protected circuits (internal circuits) NC1 to NCm connected to the signal pads PD1 to PDm, power line LS, and ground line LG; pad protection circuits HC1 to HCm; and power clamp circuits PC1 and PC2.

The power line LS and the ground line LG have wiring resistances RS1 to RSn and RG1 to RGn (indicated as lumped constants).

The protection circuitry comprises the pad protection circuits HC1 to HCm and power clamp circuits PC1 and PC2. The wiring resistances RS1 to RSn and RG1 to RGn may also be considered to be part of the protection circuitry.

In the example shown, the pad protection circuits HC1 to HCm are provided for the plurality of internal circuits NC1 to NCm connected to pads PD1 to PDm, respectively, and two power clamp circuits PC1, PC2 are provided between the power line LS and ground line LG common to the plurality of internal circuits NC1 to NCm.

The power clamp circuits PC1, PC2 limit the voltage difference between the power line LS and ground line LG; the number of power clamp circuits is not limited to the two shown in FIG. 1; there may be only one. In any case, the power clamp circuits PC1, PC2 can be provided in common for a plurality of internal circuits NC1 to NCm, and the number of internal circuits NC1 to NCm need not equal the number of power clamp circuits PC1, PC2.

The following description will use the reference character PD to denote any one of the plurality of signal pads PD1 to PDm when the description applies to all of them.

Similar generic reference characters will be used for the other circuit elements: the pad protection circuits HC1 to HCm, the internal circuits NC1 to NCm, the power clamp circuits PC1, PC2, and wiring resistances RS1 to RSn and RG1 to RGn.

Figure 2:
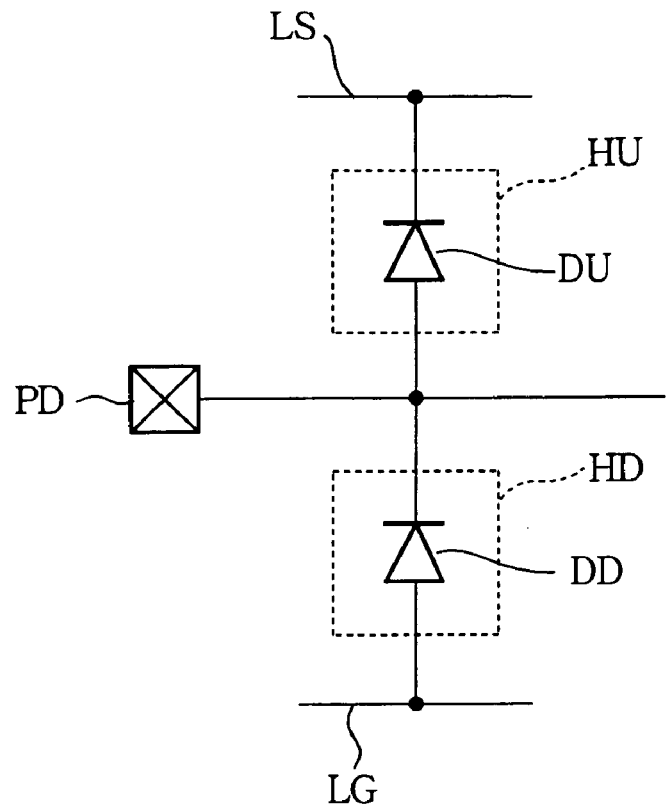
FIG. 2 is a circuit diagram showing an example of a pad protection circuit HC.

FIG. 2 shows an exemplary pad protection circuit HC. The pad protection circuit HC has an upper pad protection circuit HU and a lower pad protection circuit HL; the upper pad protection circuit HU is connected between the corresponding signal pad PD (any one of signal pads PD1 to PDm) and the power line LS; the lower pad protection circuit HD is connected to the corresponding signal pad PD and the ground line LG. The upper pad protection circuit HU comprises a diode DU; the lower pad protection circuit HD comprises a diode DD. Diode DD has its anode connected to pad PD and its cathode connected to the power line LS. Diode DD has its cathode connected to pad PD and its anode connected to the ground line LG.

In this pad protection circuit, if a voltage exceeding the potential of the power line LS is applied to pad PD, the upper diode DU becomes forward biased and conducts current, keeping the potential of PD equal to or lower than the potential of the power line LS plus the forward voltage drop, while if a voltage lower than the potential of the ground line LG is applied to pad PD, diode DD becomes forward biased and conducts current, keeping the potential of signal pad PD equal to or higher than the potential of the ground line LG plus the forward voltage drop.

When the pad protection circuit HC has an upper pad protection circuit HU and a lower pad protection circuit HD as in the example in FIG. 2, if a voltage surge is applied to pad PD, it may be shunted on a path through the upper or lower pad protection circuit HU or HD of the pad protection circuit HC connected to that pad PD to the power line LS or ground line LG, or a path through the upper pad protection circuit HU, the power line LS, and the power clamp circuit PC1 or PC2 to the ground line LG, or a path through the lower pad protection circuit HD, the ground line LG, and the power clamp circuit PC1 or PC2 to the power line LS.

Figure 3:
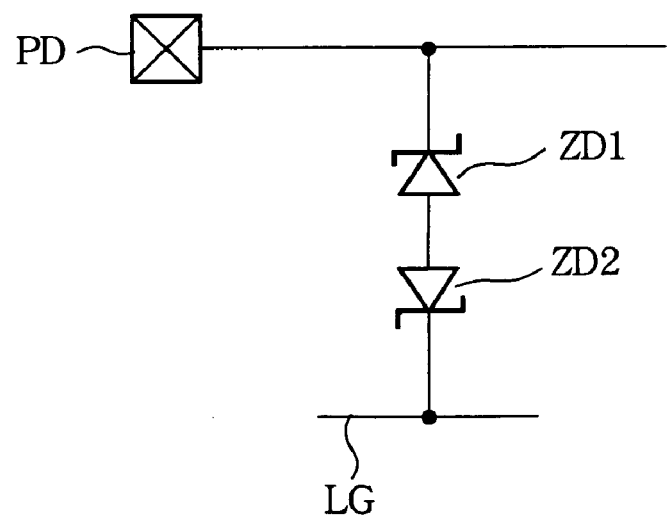
FIG. 3 is a circuit diagram showing another example of a pad protection circuit HC.

Another exemplary pad protection circuit HC is shown in FIG. 3. This pad protection circuit HC has a pair of Zener diodes ZD1, ZD2 connected in back-to-back series between pad PD and the ground line LG; if a high voltage is applied, one of the Zener diodes is forward biased; if the voltage is above the Zener voltage of the other Zener diode, the series circuit conducts current, keeping the potential of pad PD within a certain range.

Figure 4:
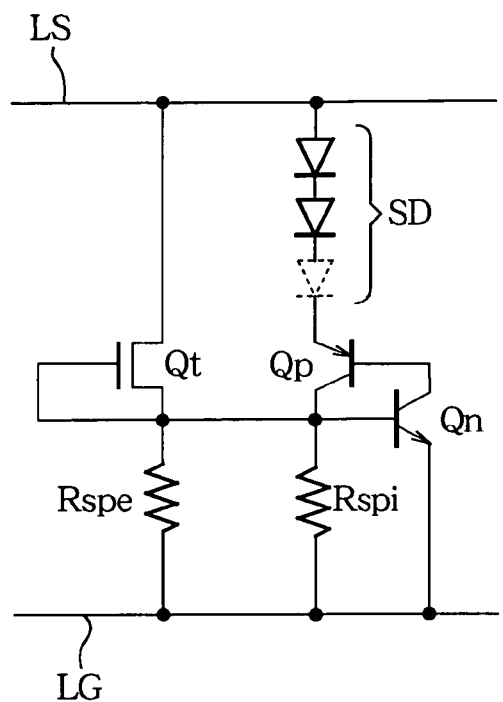
FIG. 4 is a circuit diagram showing an example of a power clamp circuit PC.

An exemplary power clamp circuit is shown in FIG. 4. In the circuit shown, an SCR is formed by an NPN transistor Qn with its emitter connected to the ground line LG and its base connected through a resistor Rspi to the ground line LG, and a PNP transistor Qp with its collector and base connected, respectively, to the base and collector of transistor Qn, and its collector connected to the base of transistor Qn, the emitter of transistor Qp being connected through a plurality of diodes SD connected in series to the power line LS. The power clamp circuit also has an NMOSFET Qt having its drain connected to the power line LS and its source and gate mutually interconnected, and a resistor Rspe having one end connected to the source of NMOSFET Qt and another end connected to the ground line LG. NMOSFET Qt is normally switched off, but if a high voltage is applied to the power line LS, the NMOSFET Qt conducts current, switching on the SCR.

Figure 5:
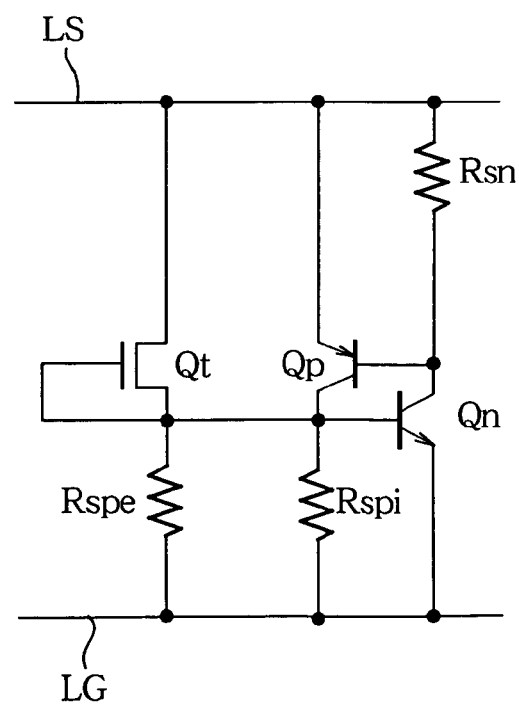
FIG. 5 is a circuit diagram showing another power of a clamp circuit PC.

Another exemplary power clamp circuit PC is shown in FIG. 5. The circuit shown in FIG. 5 is similar to the circuit shown in FIG. 4, but differs in that the emitter of transistor Qp is connected directly to the power line LS, and its base is connected through a resistor Rsn to the ground line LS.

As in the circuit in FIG. 4, the SCR is switched on if NMOSFET Qt conducts current due to a high voltage.

The circuits shown in FIGS. 4 and 5 are discussed in the document "High Holding Current SCRs (HHI-SCR) for Power ESD Protection and Latch-up Immune IC Operation" (EOS/ESD Symp., 1A. 3, 2002) by M. P. J. Mergens, C. C. Russ, K. G. Verhaege, J. Armer, P. C. Jozwiak, and R. Mohn cited above.

Figure 6:
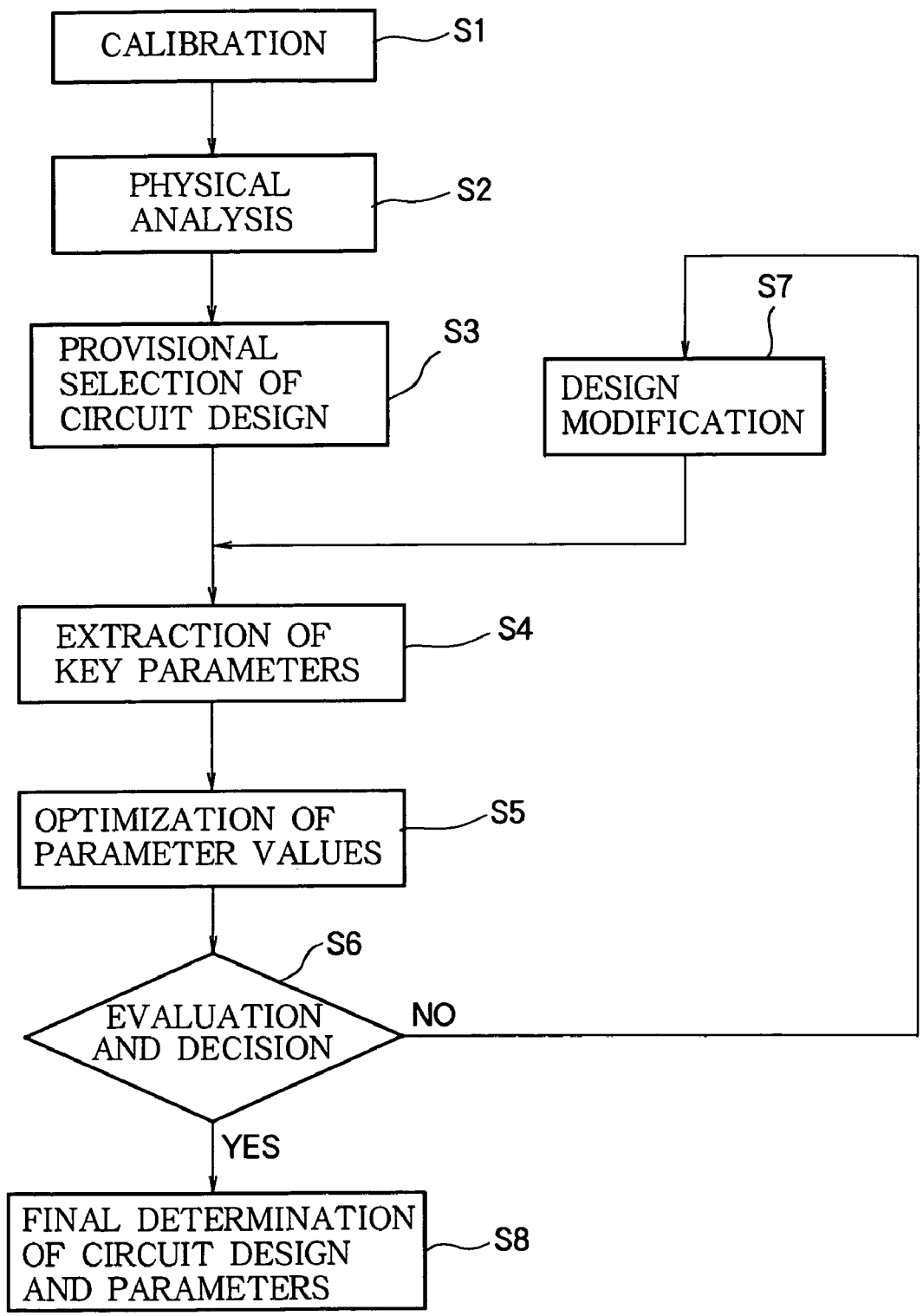
FIG. 6 is a flowchart illustrating a method of designing an ESD protection circuit in a first embodiment.

FIG. 6 is a flowchart illustrating a method of designing an ESD protection circuit in a first embodiment of the invention. The illustrated design method for an ESD protection circuit in the first embodiment includes a calibration step S1, a physical analysis step S2, a provisional circuit design step S3, a key parameter extraction step S4, a parameter value optimization step S5, an evaluation step S6, a circuit design modification step S7, and a circuit design and parameter value final determination step S8.

Figure 7:
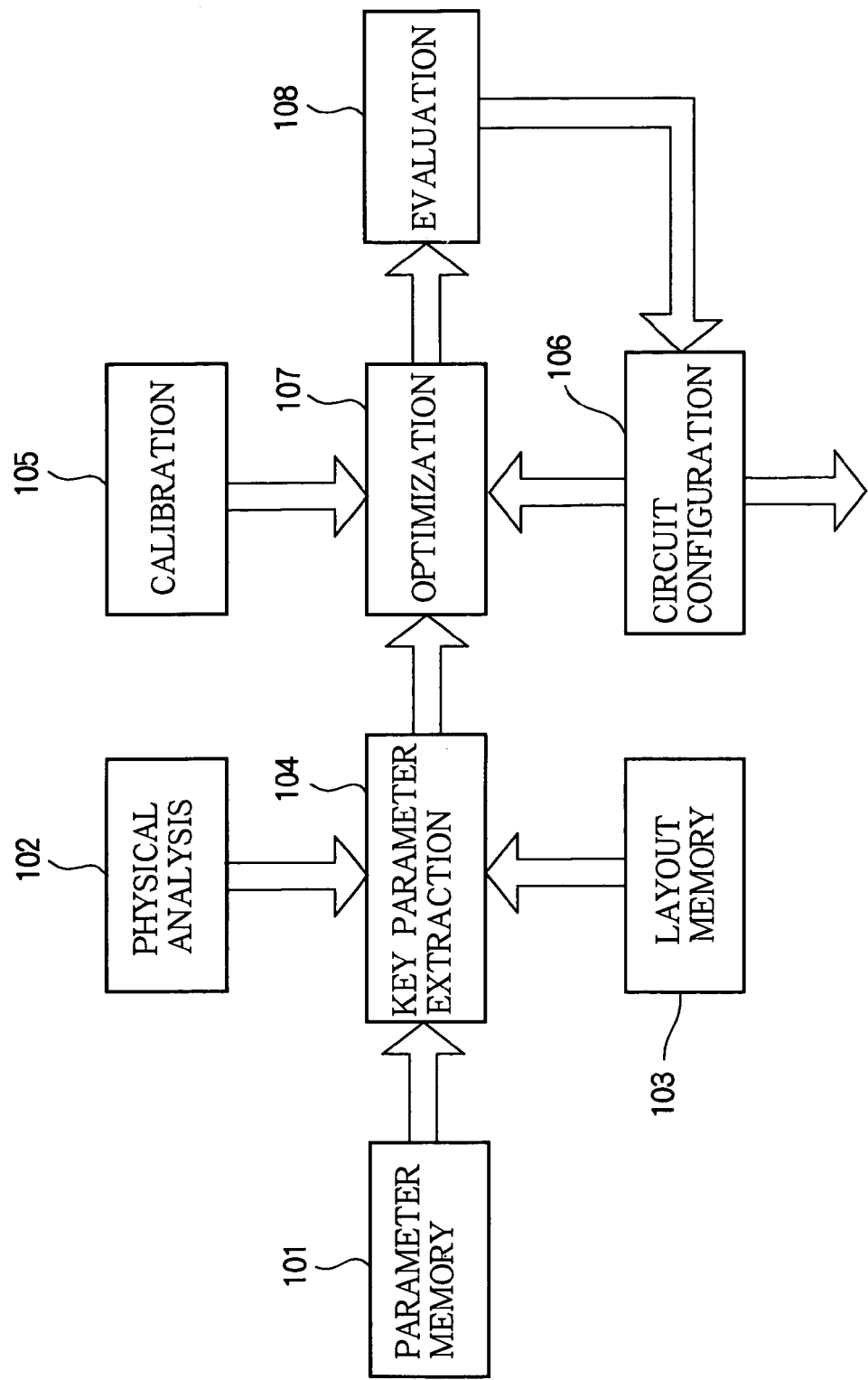
FIG. 7 is a block diagram of equipment used in the method of designing an ESD protection circuit in the first embodiment.

FIG. 7 illustrates the structure of the equipment used in the method of designing an ESD protection circuit in this embodiment. The equipment comprises a parameter memory unit 101 that stores parameters of the elements used in the ESD protection circuit, a physical analysis unit 102 that performs a physical analysis of the elements used in the ESD protection circuit, a layout memory unit 103 that stores the layout of the integrated circuit, a key parameter extraction unit 104 that extracts key parameters according to data obtained from the parameter memory unit 101, physical analysis unit 102, and layout memory unit 103, a calibration unit 105 that calibrates parameters of a simulation model, a circuit configuration unit 106 that provisionally determines and modifies the circuit design, an optimization unit 107 that optimizes the key parameters through a mixed-mode device-circuit simulation according to the data obtained from the calibration unit 105 and circuit configuration unit 106, and an evaluation unit 108 that evaluates the ESD protection circuit characteristics under the optimized parameters and determines whether the characteristics are satisfactory. A programmed computer may take the role of the key parameter extraction unit 104, calibration unit 105, circuit configuration unit 106, optimization unit 107, and evaluation unit 108. A memory unit from which data can be read by the computer may take the role of the parameter memory unit 101 and layout memory unit 103. One or more measurement devices that can perform data communication with the computer, and a computer programmed to carry out simulations, may perform part of the role of the physical analysis unit 102.

In the calibration step S1 in FIG. 6, the model parameters of the elements used in the ESD protection circuit are calibrated. In this step, for example, the parameters of each element in the simulation model may be set independently. In the present embodiment, a mixed-mode simulation is performed in the optimization step S5 described below, so the simulation model used in step S1 is also a model for that type of mixed-mode simulation.

In the physical analysis step S2, a physical analysis of each of the elements used in the ESD protection circuit and internal circuit, especially MOSFETs, diodes, wiring resistances, and the like, is performed on the basis of measurement data. The physical analysis referred to here includes measurement of MOSFET breakdown characteristics, photoemission analysis, impact ionization measurement, measurement of hole current density distribution (in PMOSFETs), and measurement of electron current density (in NMOSFETs).

The physical analysis is carried out to determine which parameters have a relatively large impact on ESD protection characteristics.

Figure 8:
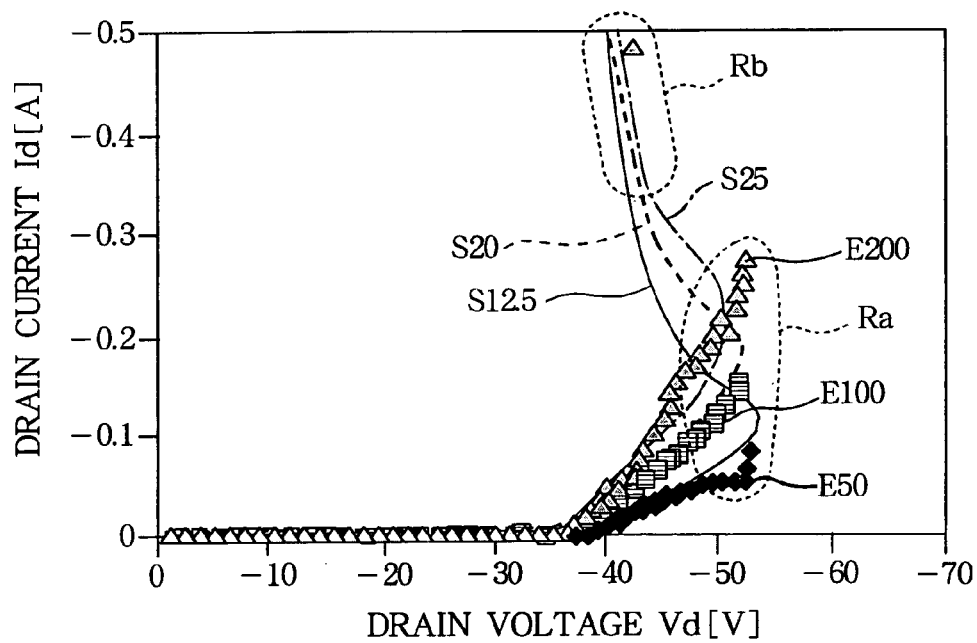
FIG. 8 shows a MOSFET breakdown characteristic.

The MOSFET breakdown characteristic indicates the change in drain current Id when the gate and source voltages are fixed at 0 V and the drain voltage Vd is swept up from 0 V, as shown in FIG. 8. Both measured data and simulation data are shown in FIG. 8. E50, E100, and E200 indicate measured data with respective channel widths of 50 μm, 100 μm, and 200 μm, while curves S12.5, S20, and S25 are simulation data with respective channel widths of 12.5 μm, 20 μm, and 25 μm.

As shown, with the rise of the drain voltage Vd, avalanche breakdown occurs in a breakdown region Ra; after avalanche breakdown, in a holding region Rb, the current increases at a lower voltage (referred to as the holding voltage or snapback voltage) and the current becomes substantially constant. If the current increases beyond the holding region Rb, the element is destroyed by thermal runaway. The internal circuit is protected by use of this type of MOSFET breakdown characteristic, by shunting a large current into a MOSFET.

From the drawing it can be seen that although the current at the time of breakdown (breakdown current) depends on the gate width, a doubling or quadrupling of the gate width ('w=50, 100, 200' in the example shown) does not produce a doubling of the breakdown current; the increase is by a smaller factor.

A photoemission analysis uses a photoemission microscope to detect light emitted from a failure site, uses a CCD camera or the like to capture an image of the emitted light, and displays the image superimposed on a diagram representing the structure of the semiconductor device, whereby the position of the failure site can be precisely identified.

Figure 9:
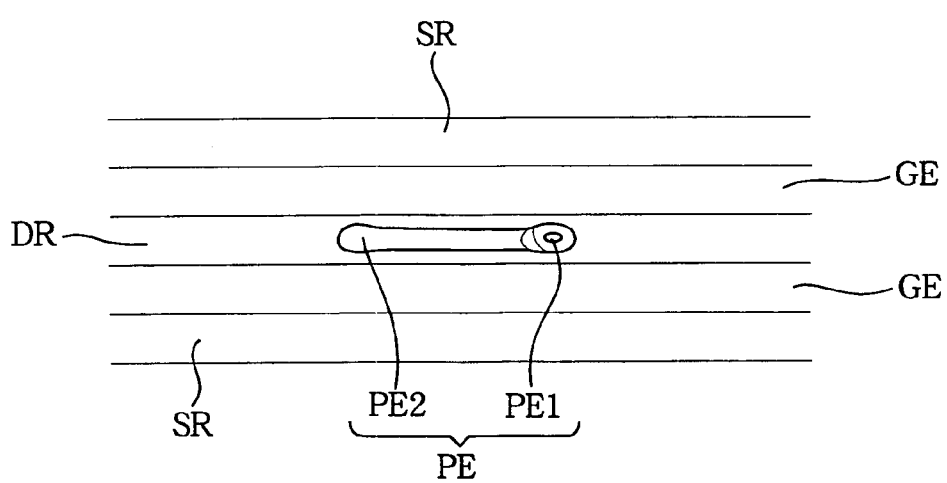
FIG. 9 shows an example of photoemission analysis results for 200-mA drain current.

FIG. 9 shows an example of a photoemission analysis result when the drain current flow is 200 mA. SR, DR, and GE in the drawing respectively indicate the source regions, drain region, and gate electrodes, and region PE indicates the place where photoemission occurs; in region PE, region PE1 indicates the location of highest photoemission density; region PE2 indicates a location with a lower photoemission density.

From the photoemission analysis, it can be seen that the site of destruction by heat following breakdown is concentrated at a single point in the drain region.

Impact ionization means ionization occurring because between the source and drain, electrons are accelerated by an electric field and collide with the bonds of silicon (Si) atoms forming the crystalline lattice (whereby the avalanche is triggered). Locations of high electric field strength can be detected by detecting the density of impact ionization. The impact ionization density can be obtained by measuring the substrate current and performing a simulation on the basis of the measured results and the breakdown characteristic.

Figure 10:
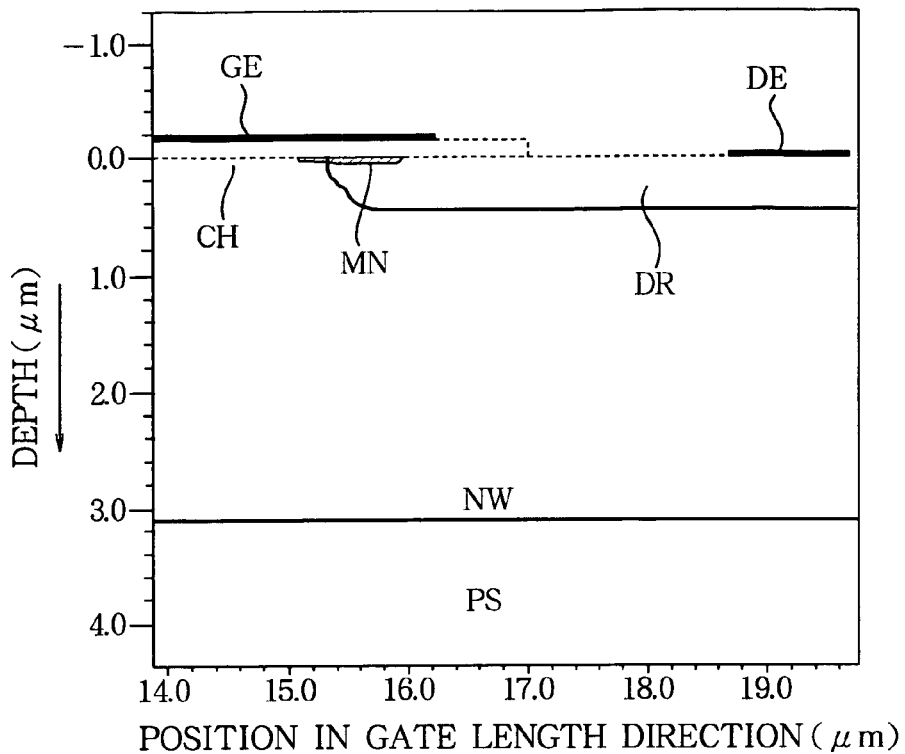
FIG. 10 shows results of a determination of impact ionization density in the breakdown region.
Figure 11:
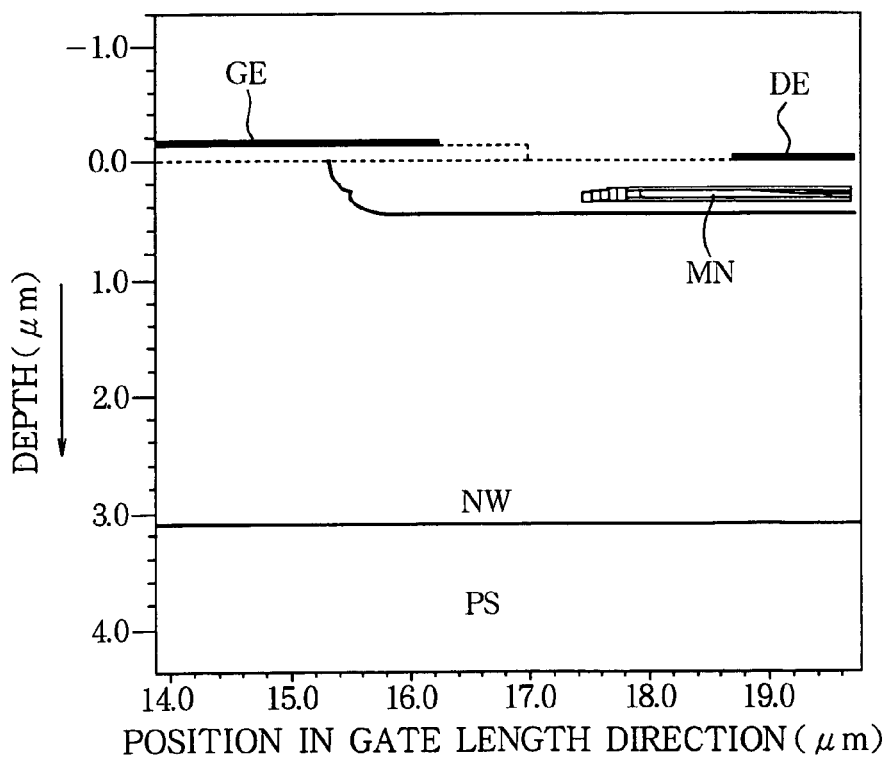
FIG. 11 shows results of a determination of impact ionization density in the holding region.

FIGS. 10 and 11 show results obtained for the impact ionization density. The horizontal axis in these drawings indicates position (relative position) in the length direction of the gate, extending from within part of the gate electrode GE to within part of the drain region DE; the vertical axis indicates the depth dimension. PS indicates the p-type substrate, and NW indicates an n-type well. MN indicates the site of high impact ionization density. FIG. 10 indicates the impact ionization density in region Ra in FIG. 8; FIG. 11 indicates the impact ionization density in region Rb in FIG. 8.

It can be seen that in region Ra, the part with high impact ionization density is on the border between the drain region (impurity region) DR and channel CH, while in region Rb, impact ionization is focused near the drain electrode DE (away from the channel CH).

Hole current density, which is the density of hole current in a semiconductor element, can be obtained by measuring the substrate current and performing a simulation on the basis of the measured results and the breakdown characteristic.

Figure 12:
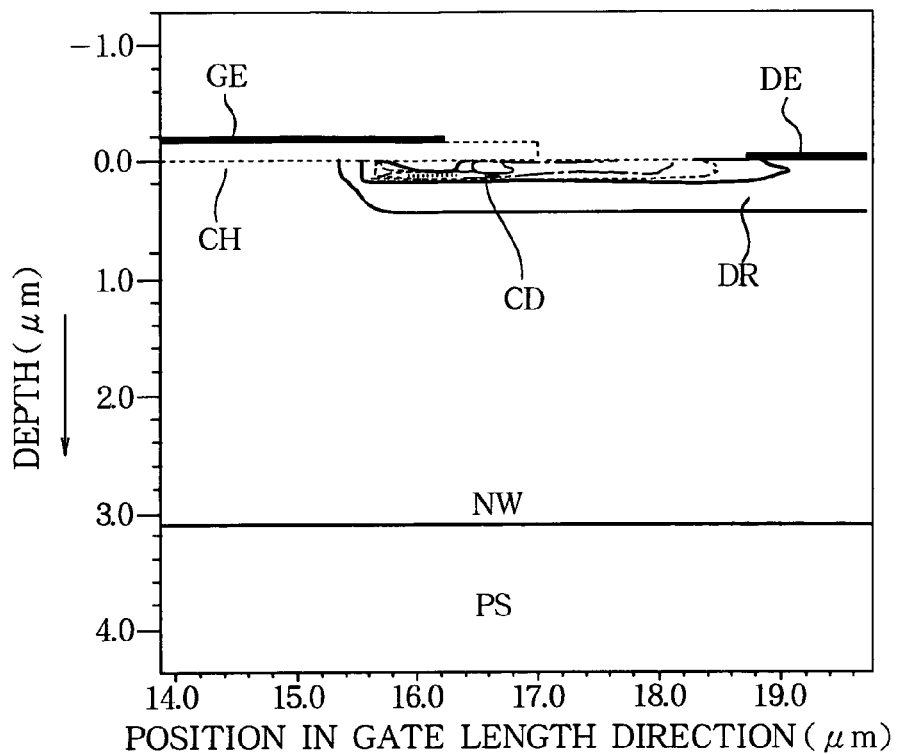
FIG. 12 shows results of a determination of hole current density in the breakdown region.
Figure 13:
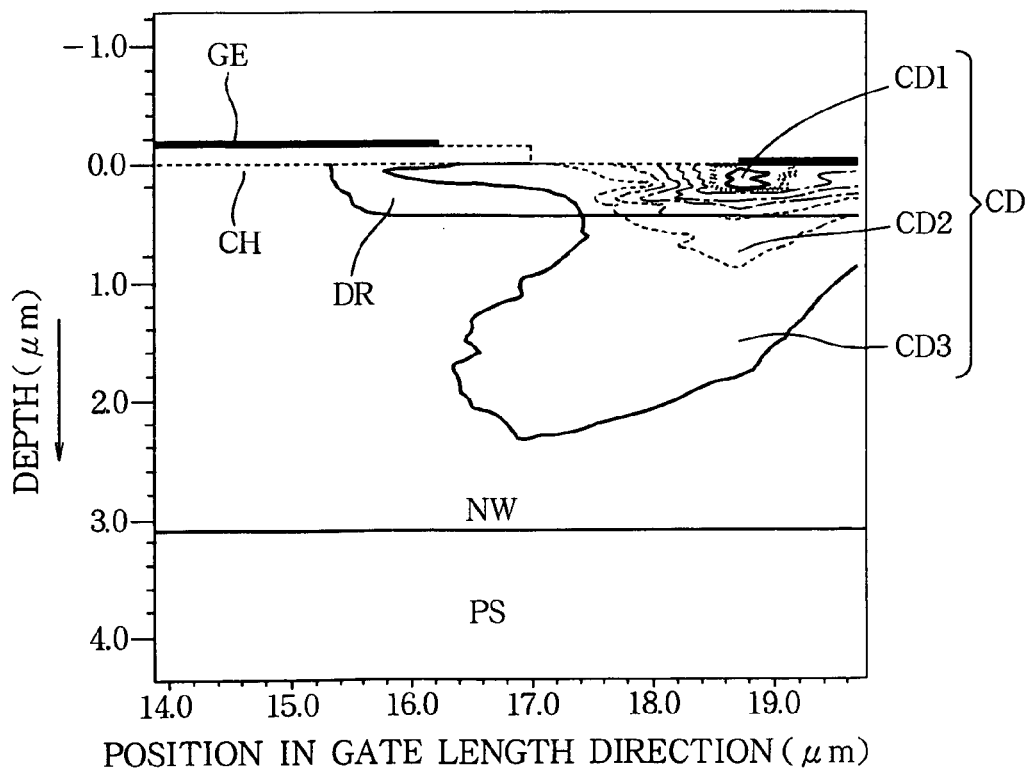
FIG. 13 shows results of a determination of hole current density in the holding region.

FIGS. 12 and 13 show result obtained for the hole current density. The horizontal axis in these drawings indicates position (relative position) in the length direction of the gate, extending from within part of the gate electrode GE to within part of the drain region DE; the vertical axis indicates the depth dimension. PS indicates the p-type substrate, and NW indicates an n-type well. CD indicates the region of high hole current density, within which the part indicated by reference characters CD1 has the highest density, and the parts indicated by reference characters CD2 and CD3 have successively lower densities. FIG. 12 shows the hole current density in region Ra in FIG. 8; FIG. 13 shows the hole current density in region Rb in FIG. 8.

In region Ra, the hole current of the element is focused near the surface; in region Rb it is diffused in the depth direction. From this it can be seen that the dependence of the drain current on the gate width is lowered in region Rb.

Returning to FIG. 6, in the provisional circuit design step S3, the circuit design of the ESD protection circuit is provisionally determined from physical analysis results such as the above, with conditions, constraints, and the like imposed by the layout of the semiconductor integrated circuit and the semiconductor fabrication process also taken into consideration. An exemplary provisional decision is to use the circuit shown in FIG. 2 as the pad protection circuit HC and the circuit shown in FIG. 4 as the power clamp circuit PC.

Figure 14:
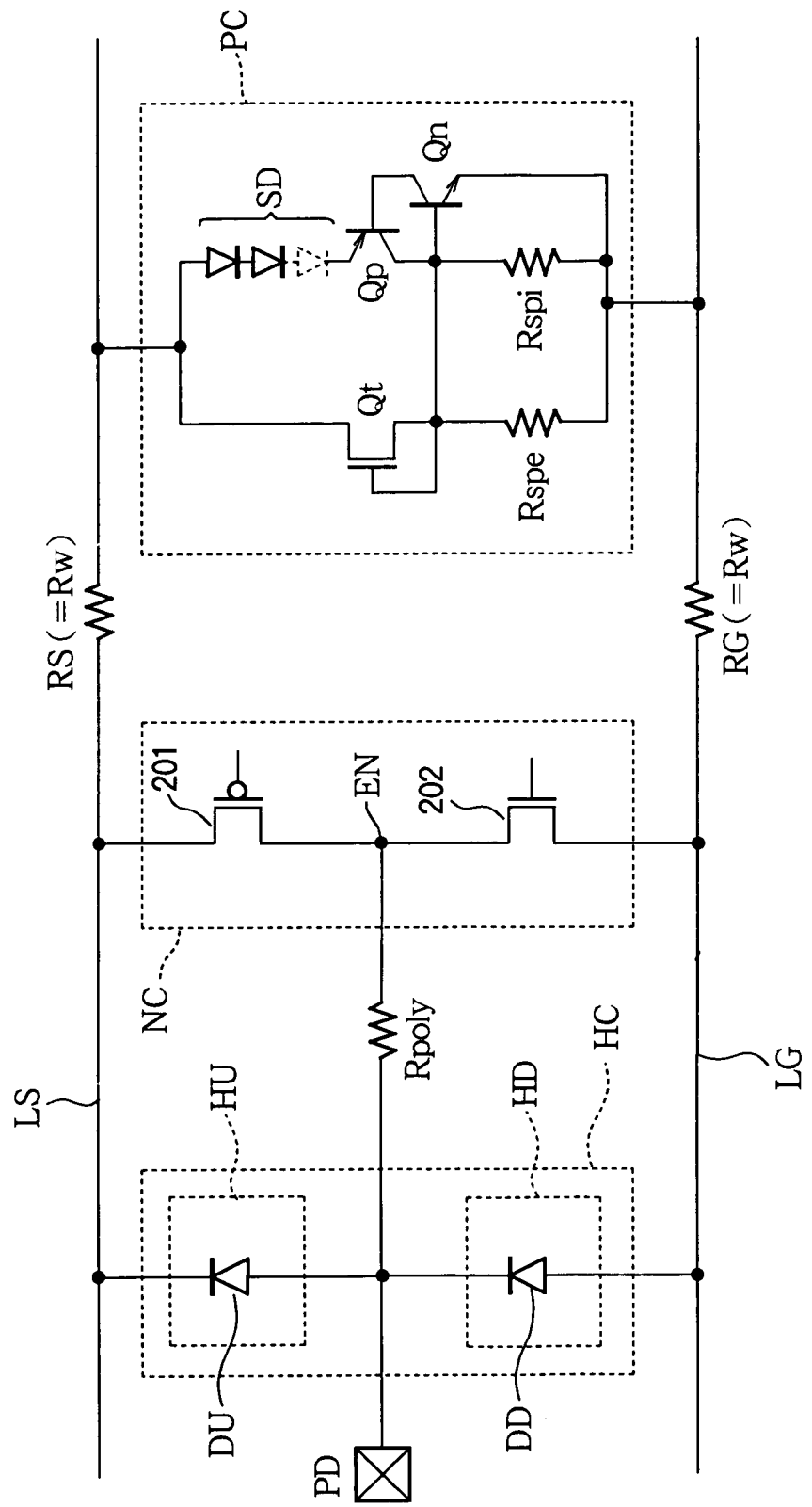
FIG. 14 is a circuit diagram showing a circuit including one pad protection circuit HC, one power clamp circuit PC, and an internal circuit NC.

FIG. 14 shows a circuit including one pad protection circuit HC and one power clamp circuit PC selected as above, and one internal circuit NC. Also shown in FIG. 14 as one example of the internal circuit NC are a PMOSFET 201 connected between an external connection node EN and the power line LS, an NMOSFET 202 connected between node EN and the ground line LG, and an internal protection resistor Rpoly inserted between node EN and pad PD.

An example of a layout condition or constraint is whether or not there is any margin in the wiring length; an example of a fabrication process condition or constraint is whether the impurity density is fixed or not.

In the key parameter extraction step S4, key parameters are extracted from the parameters of the elements constituting the circuit provisionally selected in step S3 according to the results of the physical analysis in step S2. The key parameters referred to here are the parameters that are determined in the physical analysis to have a comparatively large impact on characteristics, such as ESD immunity, that are related to ESD protection of the elements. In the circuit shown in FIG. 14, for example, the dimensions, for example, the gate width, of the MOSFET Qt used in the power clamp circuit PC, the values of the wiring resistance RS of the power line LS and the wiring resistance RG of the ground line LG, and the channel widths of diodes DU, DD in the pad protection circuit HC are extracted as key parameters. It will be assumed that the wiring resistance RS of the power line LS is substantially equal to the wiring resistance RG of the ground line LG, and the symbol Rw will be used to represent them (RS=RG=Rw).

Figure 15:
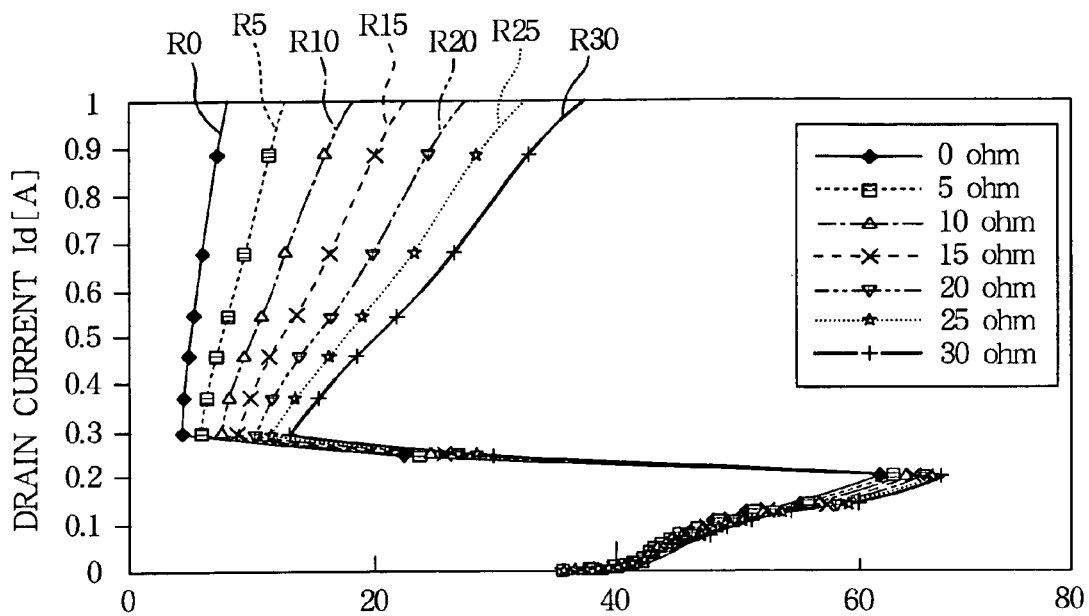
FIG. 15 illustrates a relation between wiring resistance Rw and the breakdown characteristic (the dependency of the breakdown characteristic on the wiring resistance)

The relationship between the wiring resistance Rw and the breakdown characteristic (the dependence of the breakdown characteristic on the wiring resistance) is shown in FIG. 15. Curves R0, R5, R10, R15, R20, R25, and R30 are for wiring resistances Rw of 0Ω, 5Ω, 10Ω, 15Ω, 20Ω, 25Ω, and 30Ω, respectively.

Figure 16:
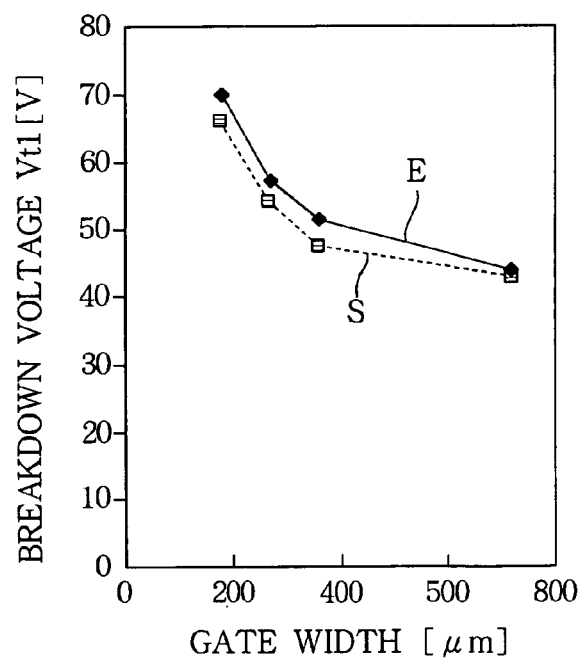
FIG. 16 illustrates a relationship between the breakdown voltage Vt1 and the gate width Wg of MOSFET Qt.

The relationship between the breakdown voltage Vt1 and the gate width Wg of MOSFET Qt is shown in FIG. 16. Curve E indicates data obtained by measurement while curve S indicates data obtained through simulation.

It can be seen from FIGS. 15 and 16 that the wiring resistance Rw has a large impact on the breakdown characteristic, and the gate width Wg has a large impact on the breakdown voltage Vt1, so that it is reasonable to select the wiring resistance Rw and gate width Wg as key parameters.

Extracting or selecting only some of the parameters as key parameters in this way simplifies the simulation in the parameter value optimization step S5 described below.

In the optimization step S5, a mixed-mode device-circuit simulation is carried out, using only the key parameters, to optimize the parameter values. This simulation is carried out on the entire semiconductor integrated circuit (the entire circuit shown in FIG. 1).

The simulation is carried out using a human body model (HBM), a machine model (MM), or the like; the parameter values are varied and the values giving the best results are selected as the optimized parameter values. The best results mean that the elements constituting the protection circuits have dimensions meeting the layout design constraints, and the load imposed by a current surge is distributed in such a way that none of the elements is destroyed. If the destruction current is unknown, the simulation calculated from the device structure before the process modification is used as a reference, and an element is regarded as having become more vulnerable to damage if its current has increased.

Figure 17:
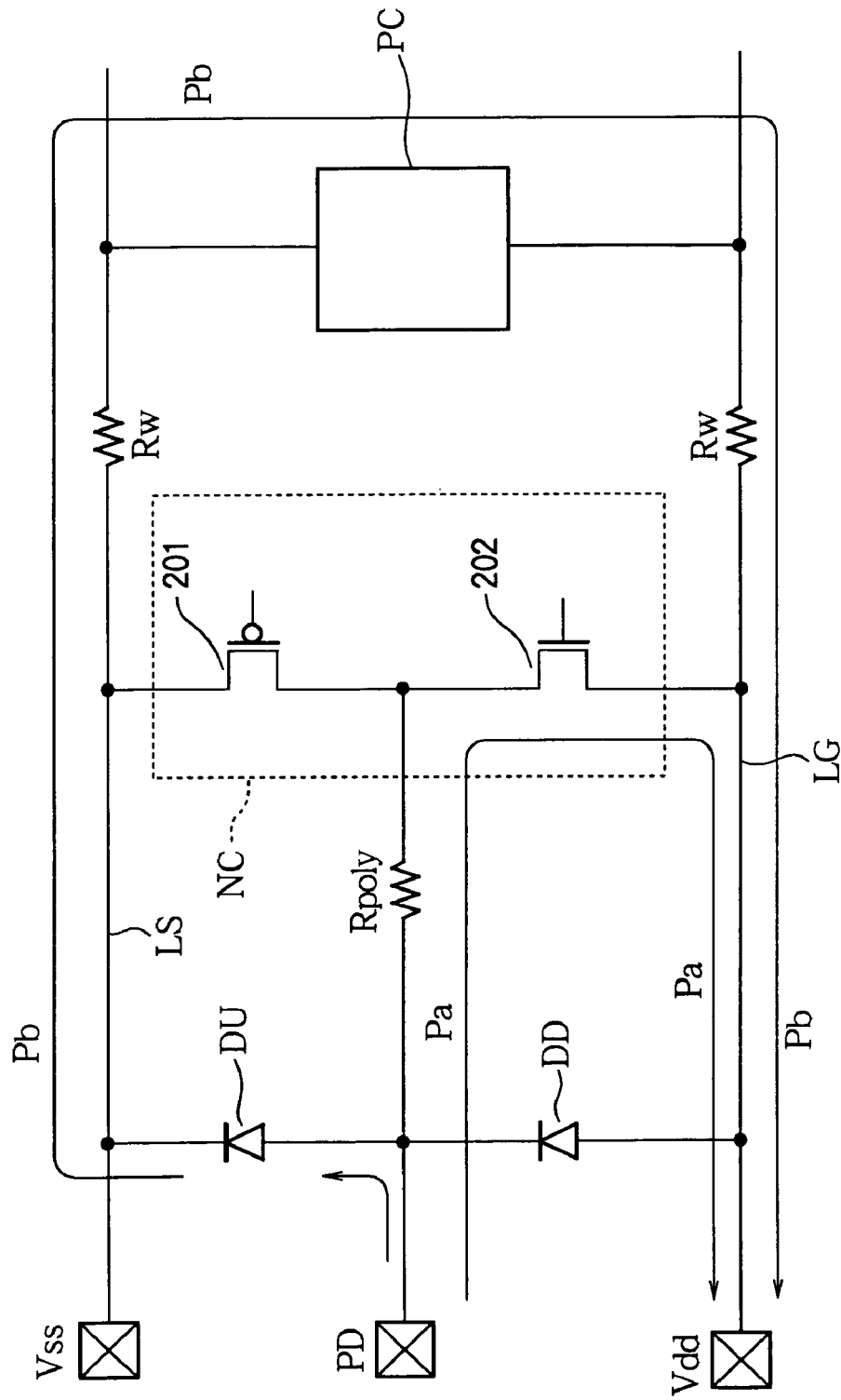
FIG. 17 is a circuit diagram illustrating the paths Pa, Pb of current when a surge is applied to the circuit in FIG. 14.
Figure 18:
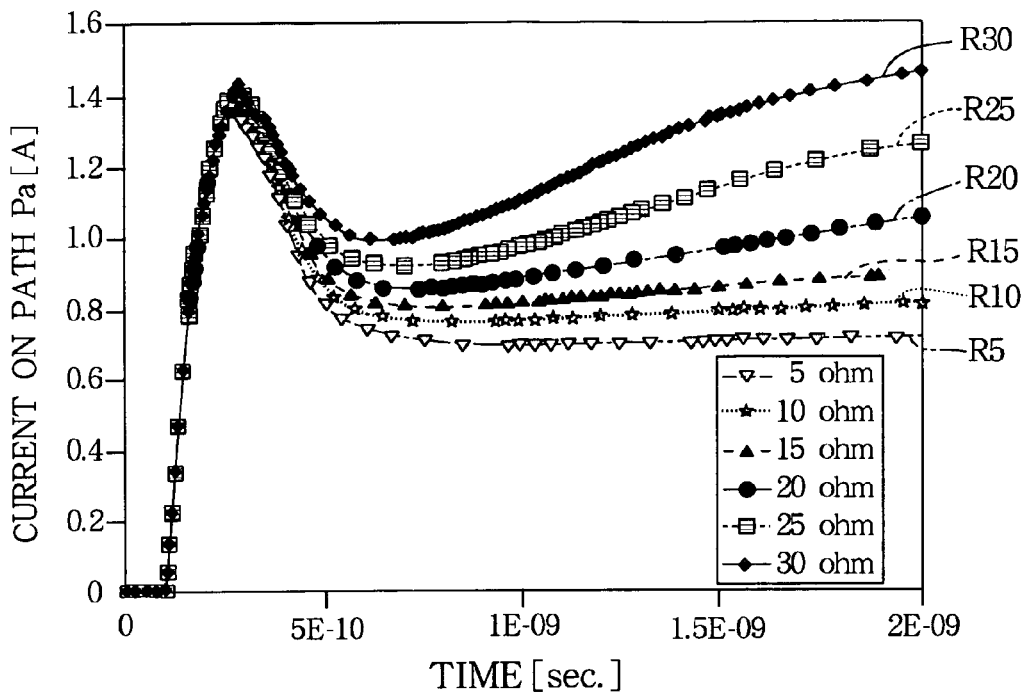
FIG. 18 shows a relationship between wiring resistance Rw and variations over time in current on path Pa when HBM +2000 V (a simulation model simulating touching of a pad by a human body charged at +2000 V) is applied to a pad PD.
Figure 19:
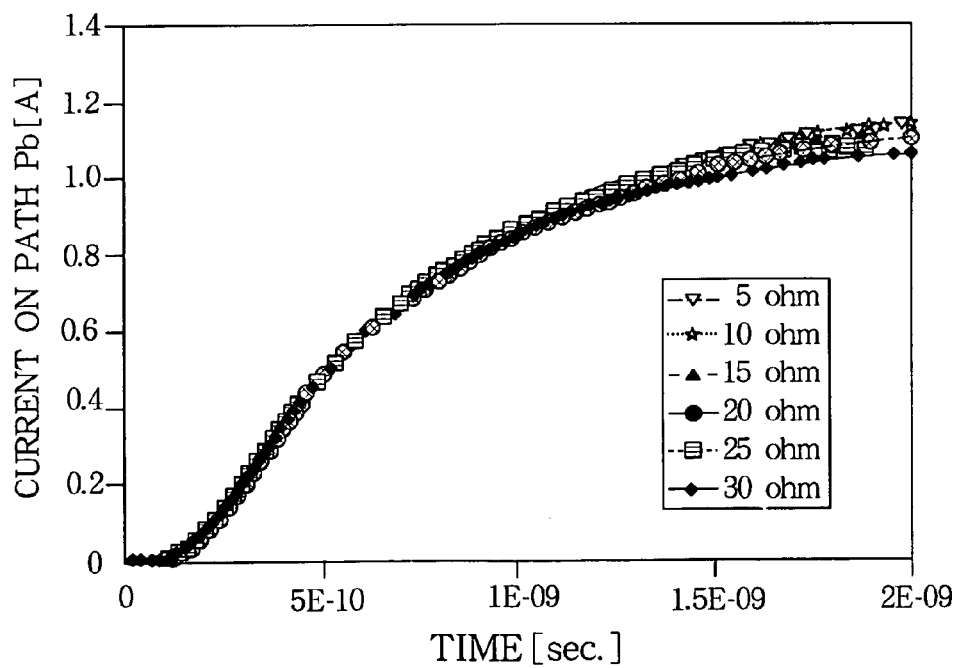
FIG. 19 shows a relationship between wiring resistance Rw and variations over time in current on path Pb when HBM +2000 V (a simulation model simulating touching of a pad by a human body charged at +2000 V) is applied to a pad PD.

FIG. 17 shows the same circuit as in FIG. 14 but with the paths Pa and Pb of surge current indicated. The depiction of the internal configuration of the power clamp circuit PC is omitted from FIG. 17. The currents flowing on the paths Pa and Pb indicated in FIG. 17 are obtained through simulation. FIGS. 18 and 19 show relationships between wiring resistance Rw and variations of current over time on paths Pa and Pb, respectively, when an HBM+2000V (a simulation model assuming pad contact by a human body charged to 2000 V) is applied to pad PD. Curves R5, R10, R15, R20, R25, and R30 are for wiring resistances Rw of 5Ω, 10Ω, 15Ω, 20Ω, 25Ω, and 30Ω.

Figure 20:
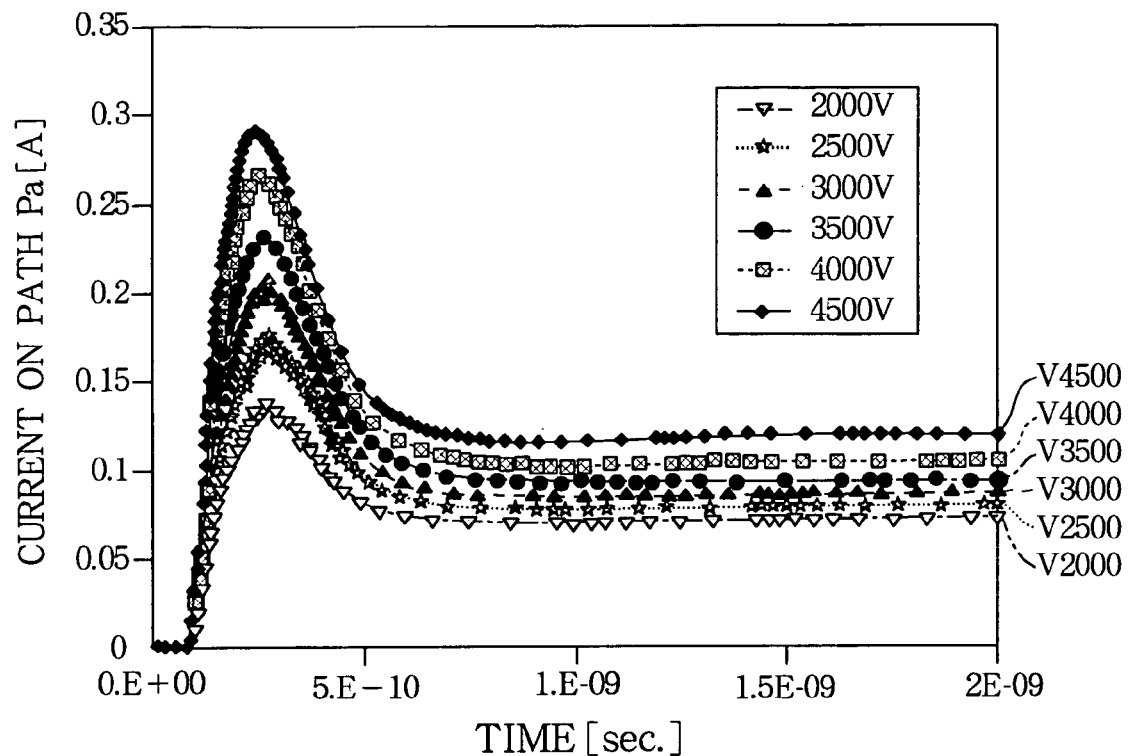
FIG. 20 shows a relationship (dependency) between current on path Pa in FIG. 17 and the voltage value of the HBM pulse.

FIG. 20 shows the relationship (dependency) between current on path Pa and the HBM pulse voltage; curves V2000, V2500, V3000, V3500, V4000, and V4500 in FIG. 20 are for HBM pulses with voltages of 2000 V, 2500 V, 3000 V, 3500 V, 4000 V, and 4500 V, respectively.

In optimization, the relationships between the parameters (wiring resistances, for example) such as those explained with reference to FIGS. 18 and 19, obtained by simulation, and the currents in each part, the HBM pulse voltage and variations in the currents in each part, and so on are combined, and the parameters by which the overall best results are obtained are found.

Returning to FIG. 6, in the evaluation step S6, the elements are given the parameter values optimized in step S5, and the result (characteristics determined by simulation) of the simulation of the circuit design that has been provisionally selected in step S3 above is evaluated.

If judged satisfactory as a result of the evaluation, the provisionally selected circuit design and circuit elements with the optimized parameters are used. More specifically, the provisionally selected circuit design is finalized as the circuit design of the ESD protection circuit.

If judged unsatisfactory as a result of the evaluation, the circuit design is modified in step S7. For example, the pad protection circuit in FIG. 2 may be replaced with the pad protection circuit in FIG. 3, or the power clamp circuit in FIG. 4 may be replaced with the power clamp circuit in FIG. 5. The processing in steps S4 to S6 is then repeated, using the modified circuit design.

By designing an ESD protection circuit as above, it is possible to shorten the time required for determining the design of the ESD circuit, reduce the number of prototypes, and shorten the time from semiconductor device development to finished product.

Second Embodiment

The second embodiment concerns a specific simulation method that can be used in the optimization step S5 in the first embodiment. The computations in this simulation are carried out with the whole or a part of an internal circuit NC replaced with a simplified equivalent circuit.

Figure 21:
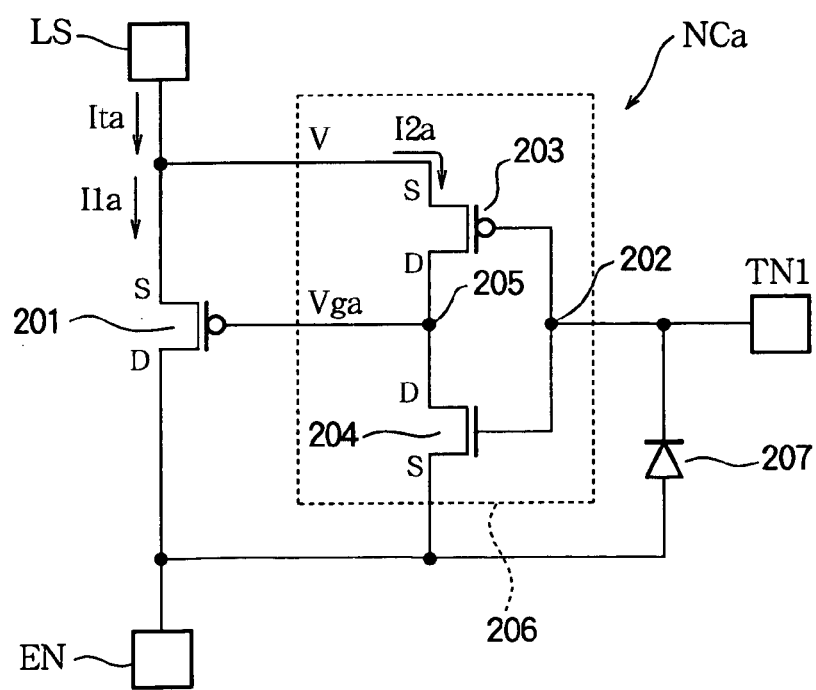
FIG. 21 is a detailed circuit diagram showing an example of circuit section NCa including PMOSFET 201 shown in the internal circuit NC shown in FIG. 14 and its input circuitry elements.

For example, the circuit section NCa including the PMOSFET 201 included in the internal circuit shown in FIG. 14 and the circuit elements connected to the input side thereof have, for example, the multi-stage configuration shown in FIG. 21. Besides PMOSFET 201, which has its source connected to the power line LS and its drain connected to node EN, the illustrated circuit section NCa has an inverter 206 having a PMOSFET 203 and an NMOSFET 204, the gates of PMOSFET 203 and NMOSFET 204 being mutually interconnected to form an input terminal 202, the drains of PMOSFET 203 and NMOSFET 204 being interconnected to form an output terminal 205 which is connected to the gate of PMOSFET 201, and a diode 207 having its cathode connected to the input terminal 202 of the inverter 206 and its anode connected to node EN. The input terminal 202 of the inverter 206 is connected to a node TN1.

Figure 22:
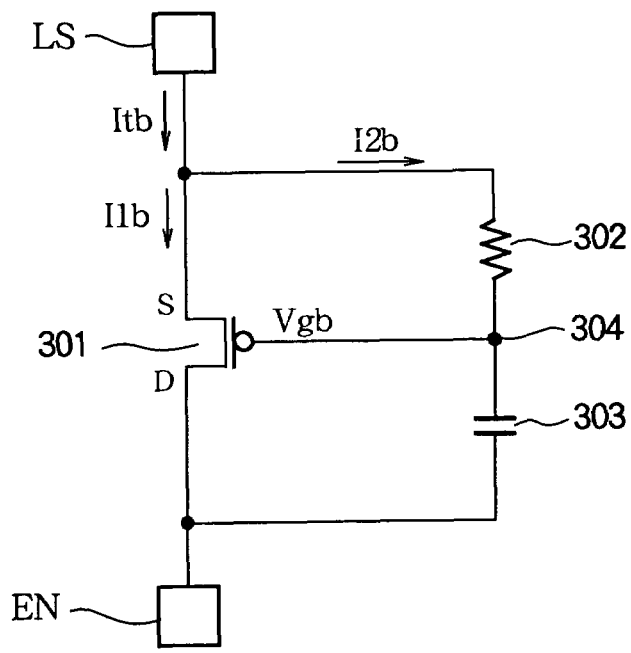
FIG. 22 is a circuit diagram showing an equivalent circuit used in simulation of the circuit in FIG. 21 in a second embodiment of the invention.

This sort of circuit section NCa, which forms one part of internal circuit NC (the circuit under simulation), is replaced with the equivalent circuit in FIG. 22. This equivalent circuit comprises one PMOSFET 301, one resistor 302, and one capacitor 303. The resistor 302 is connected in series with the capacitor 303; the first end of the resistor 302 is connected to the power line LS; the second end of the resistor 302 is connected to a first electrode of the capacitor 303; the second electrode of the capacitor 303 is connected to node EN. The node at which the resistor 302 and capacitor 303 are interconnected is connected to the gate of the PMOSFET 301; the source and drain of the PMOSFET 301 are connected, respectively, to the power line LS and node EN.

The values R1, C1 of the resistor 302 and capacitor 303 in the equivalent circuit in FIG. 22 are derived as follows. Given that PMOSFET 301 in the equivalent circuit has the same characteristics as PMOSFET 201 in the internal circuit NCa, the values of the resistor 302 and capacitor 303 are selected so that when a surge voltage is applied to the source of PMOSFET 301, the values and variation patterns of the current flowing through PMOSFET 301, the current flowing through the resistor 302, the voltage at the gate of PMOSFET 301, and the voltage at the first end of the resistor 302 (the end connected to the power line LS) are substantially the same as the values and variation patterns of the currents and voltages of the corresponding parts in the above internal circuit NCa.

More specifically, the values R1, C1 of the resistor 302 and capacitor 303 are selected so that the values and variation patterns of the current flowing through PMOSFET 301, the current flowing through the resistor 302, the voltage at the gate of PMOSFET 301, and the voltage at the first end of the resistor 302 are substantially the same as the values and variation patterns of the current flowing through PMOSFET 201, the current flowing through the inverter 206, the voltage at the gate of PMOSFET 201, and the voltage at the source of PMOSFET 203 in the inverter 206 in the internal circuit.

Figure 23:
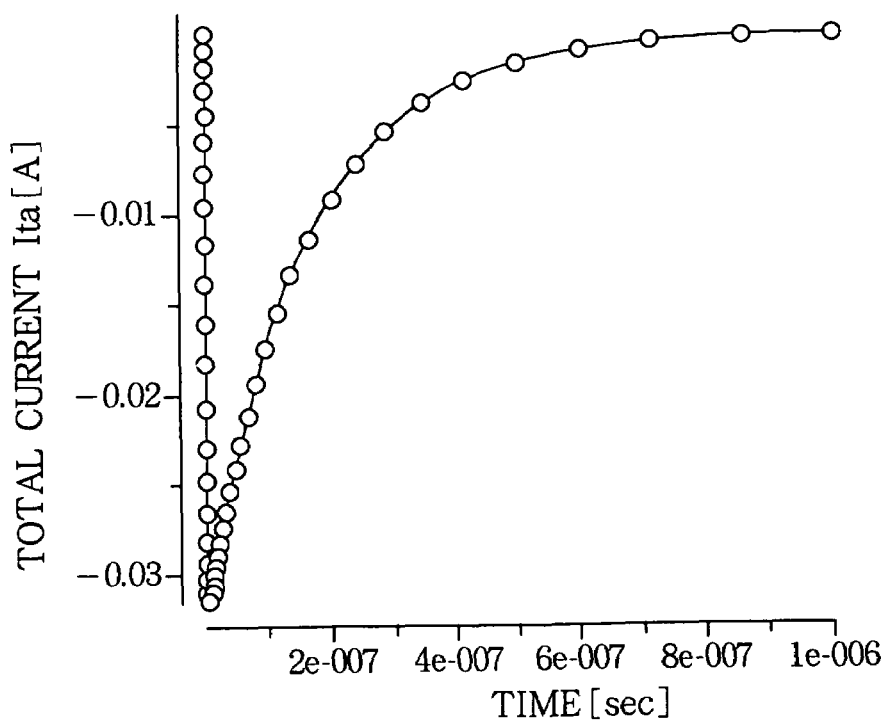
FIG. 23 shows time varying total current in the circuit section NCa shown in FIG. 21 when a negative HBM pulse (−50 V) is applied to power line LS.
Figure 24:
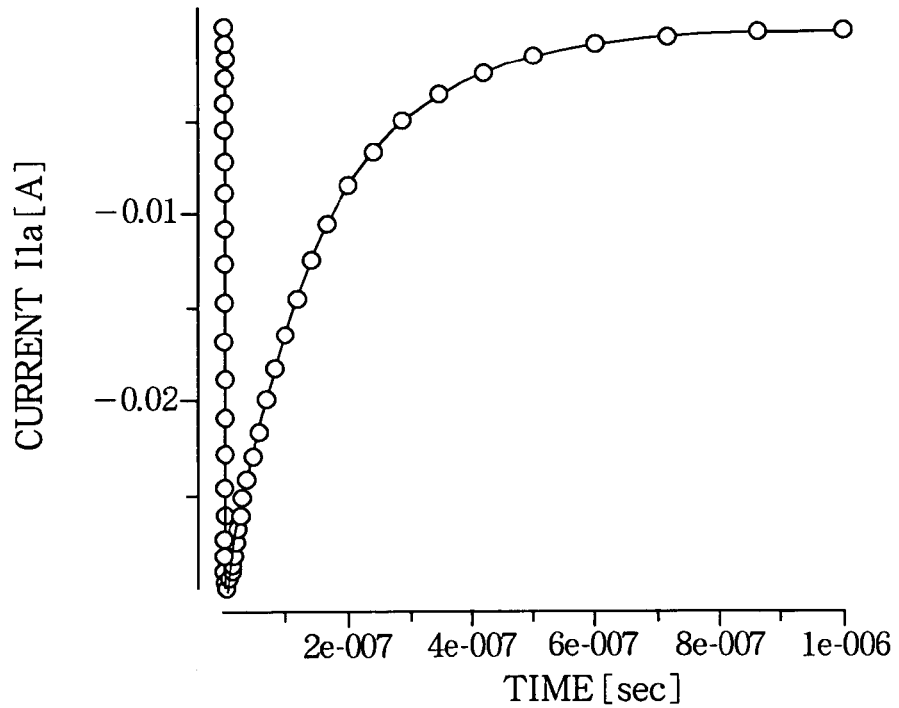
FIG. 24 shows time varying current flowing in PMOSFET 201 when a negative HBM pulse (−50 V) is applied to the power line LS in the circuit section NCa shown in FIG. 21.
Figure 25:
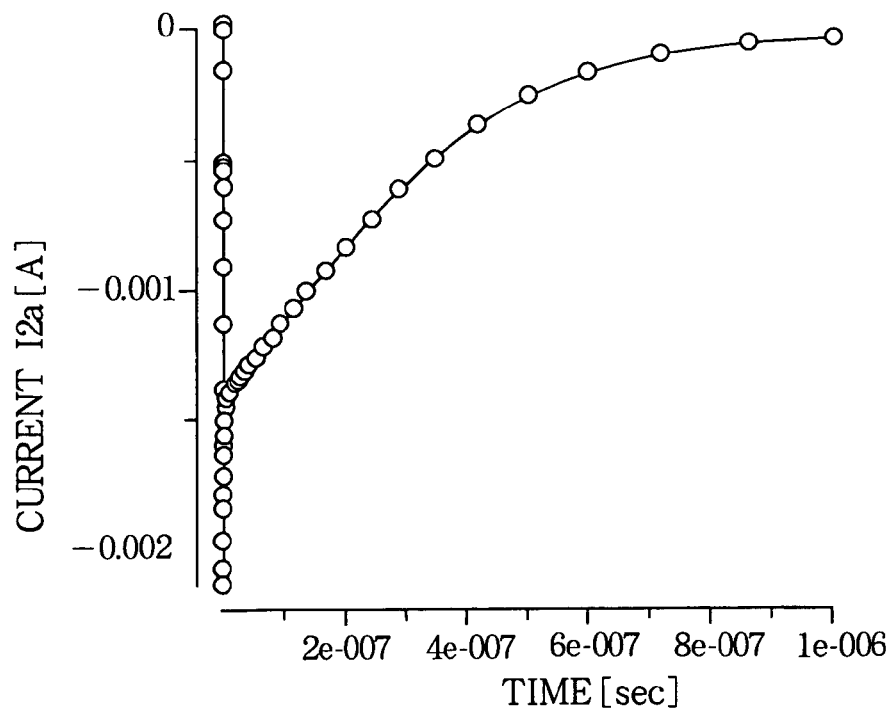
FIG. 25 shows time varying current flowing in PMOSFET 203 when a negative HBM pulse (−50 V) is applied to the power line LS in the circuit section NCa shown in FIG. 21.
Figure 26:
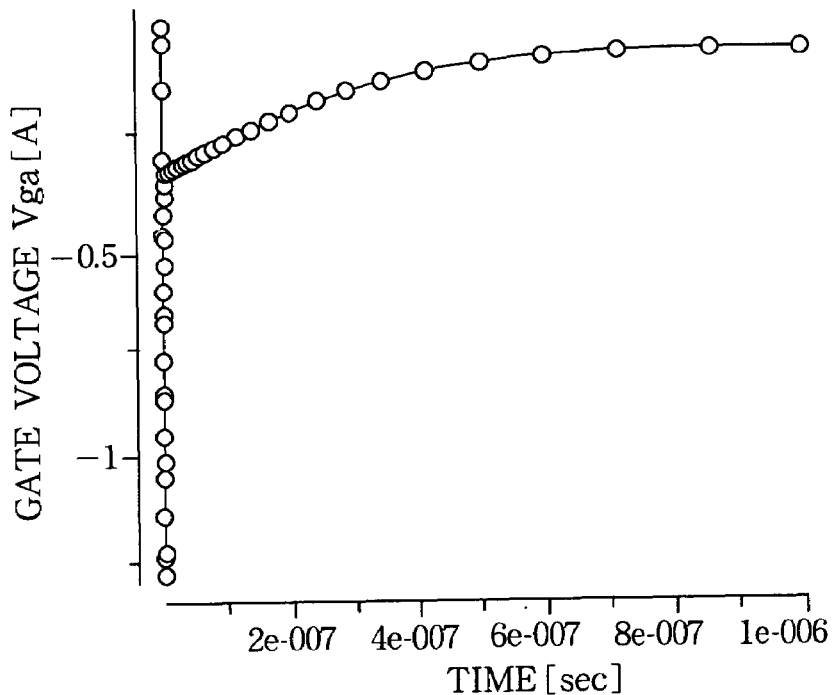
FIG. 26 shows the time varying gate voltage of PMOSFET 201 when a negative HBM-pulse (−50 V) is applied to the power line LS in the circuit section NCa shown in FIG. 21.
Figure 27:
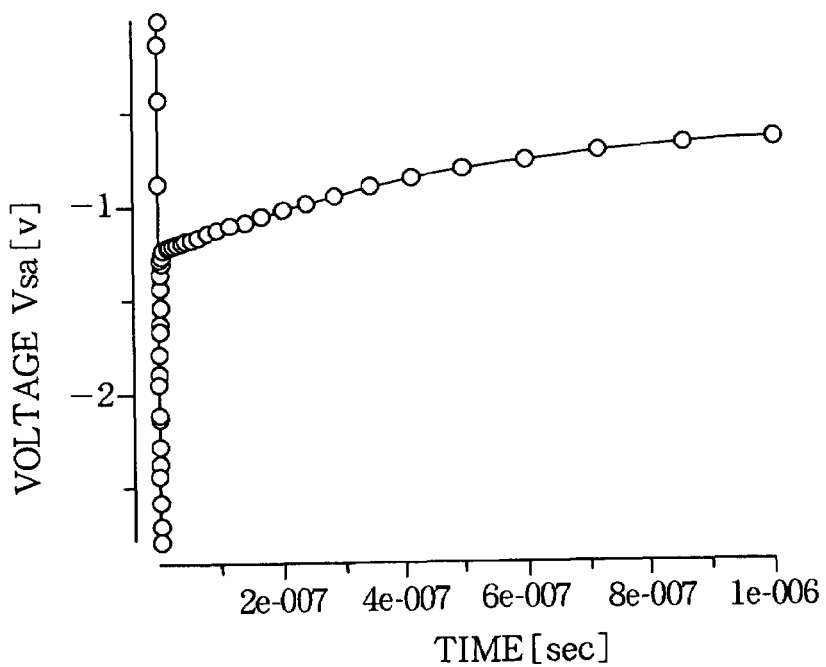
FIG. 27 shows the time varying source voltage of PMOSFET 203 when a negative HBM pulse (−50 V) is applied to the power line LS in the circuit section NCa shown in FIG. 21.

FIGS. 23 to 27 show the time varying currents and voltages in the internal circuit NCa in FIG. 21 when a negative HBM pulse (−50 V) is applied to the power line LS. FIG. 23 shows the total current Ita flowing from the power line LS shown in FIG. 21 into PMOSFET 201 and the inverter 206. FIG. 24 shows the current I1a flowing into PMOSFET 201. FIG. 25 shows the current I2a flowing into PMOSFET 203 in inverter 206. FIG. 26 shows the gate voltage Vga of PMOSFET 201; FIG. 27 shows the source voltage Vsa of PMOSFET 203.

FIGS. 28 to 37 show time varying current and voltage values in the equivalent circuit in FIG. 22 when a negative HBM pulse (−50 V) is applied to the power line LS.

Figure 28:
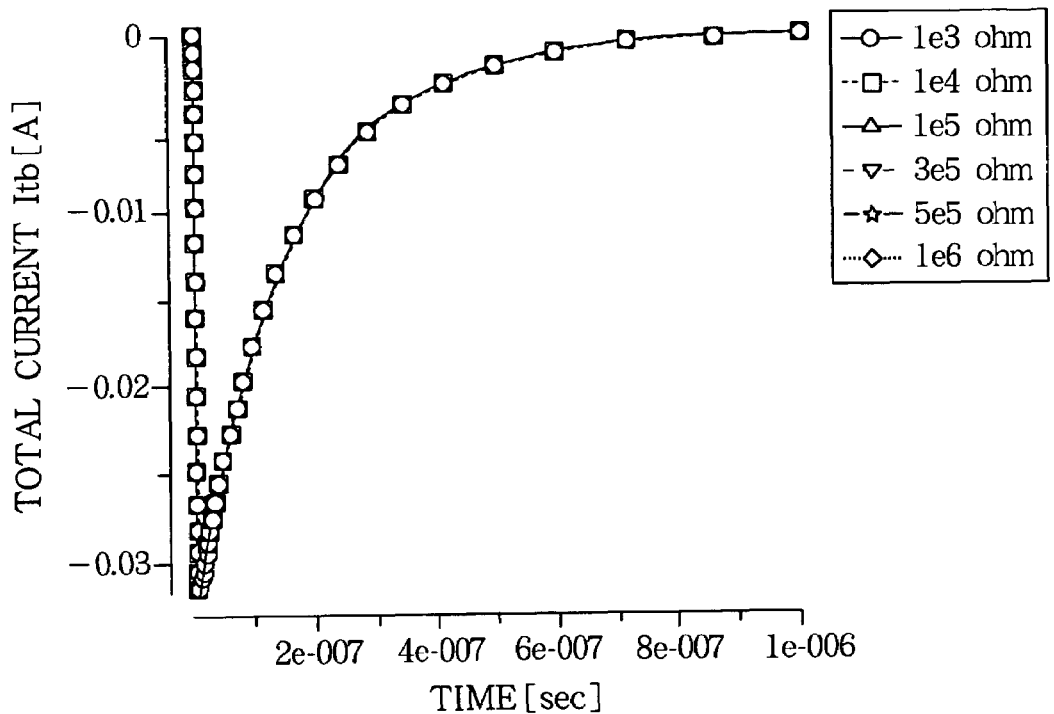
FIG. 28 shows time varying total current when a negative HBM pulse (−50 V) is applied to the power line LS in the equivalent circuit in FIG. 22.
Figure 29:
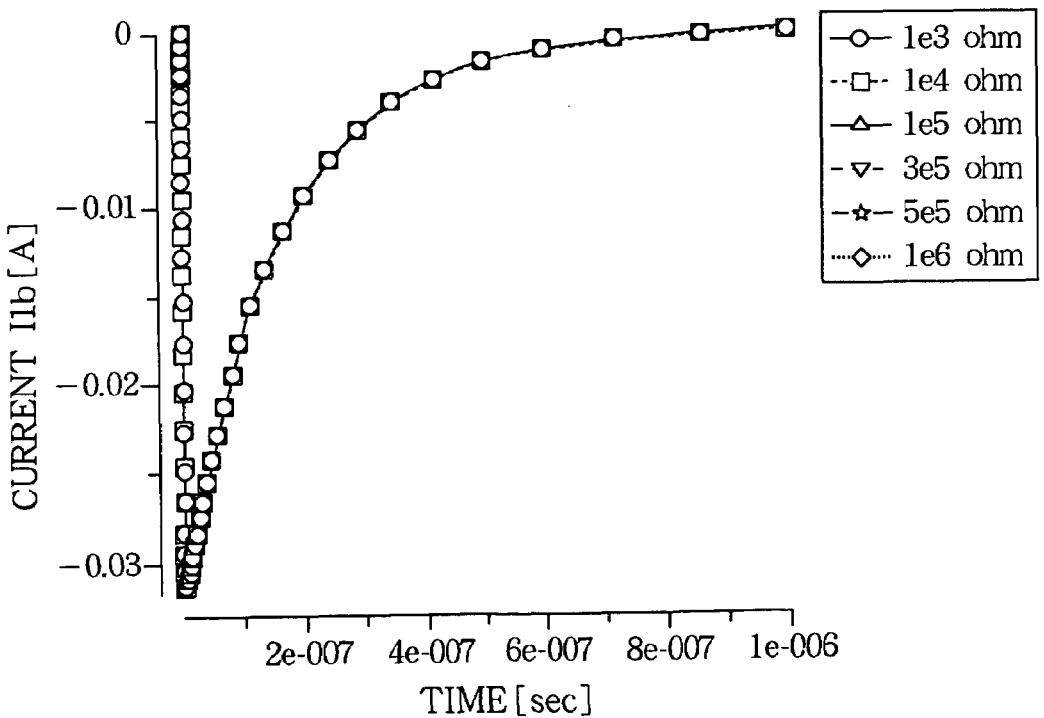
FIG. 29 shows time varying current flowing in PMOSFET 301 when a negative HBM pulse (−50 V) is applied to the power line LS in the equivalent circuit in FIG. 22.
Figure 30:
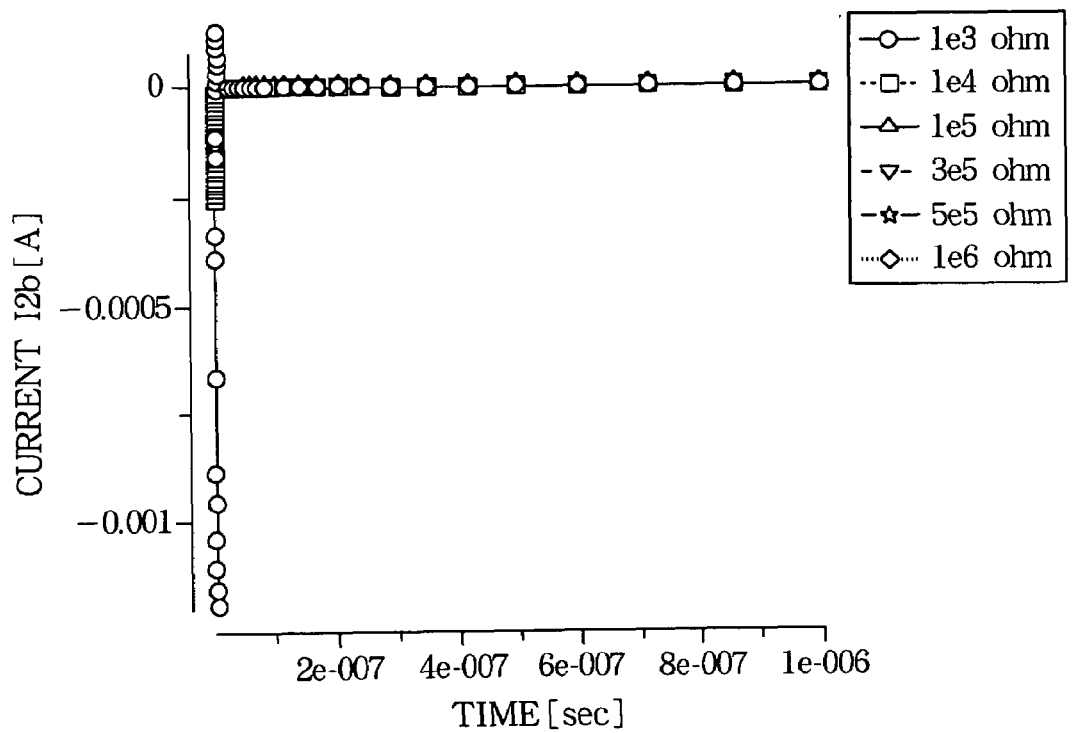
FIG. 30 shows time varying current flowing in resistor 302 when a negative HBM pulse (−50 V) is applied to the power line LS in the equivalent circuit in FIG. 22.
Figure 31:
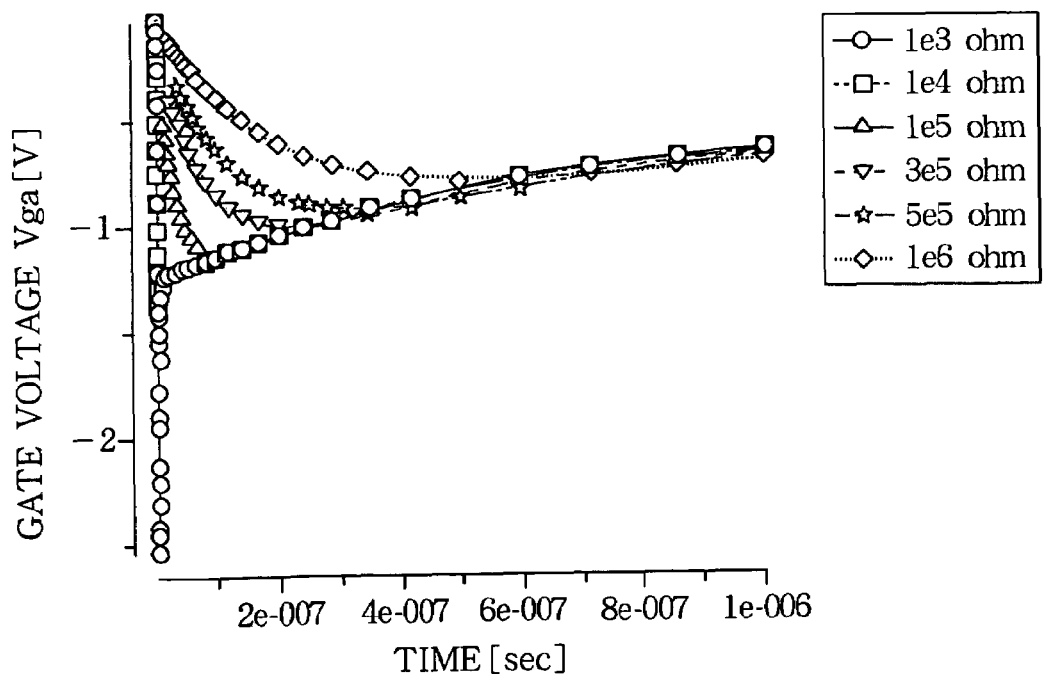
FIG. 31 shows the time varying gate voltage PMOSFET 301 when a negative HBM pulse (−50 V) is applied to the power line LS in the equivalent circuit in FIG. 22.
Figure 32:
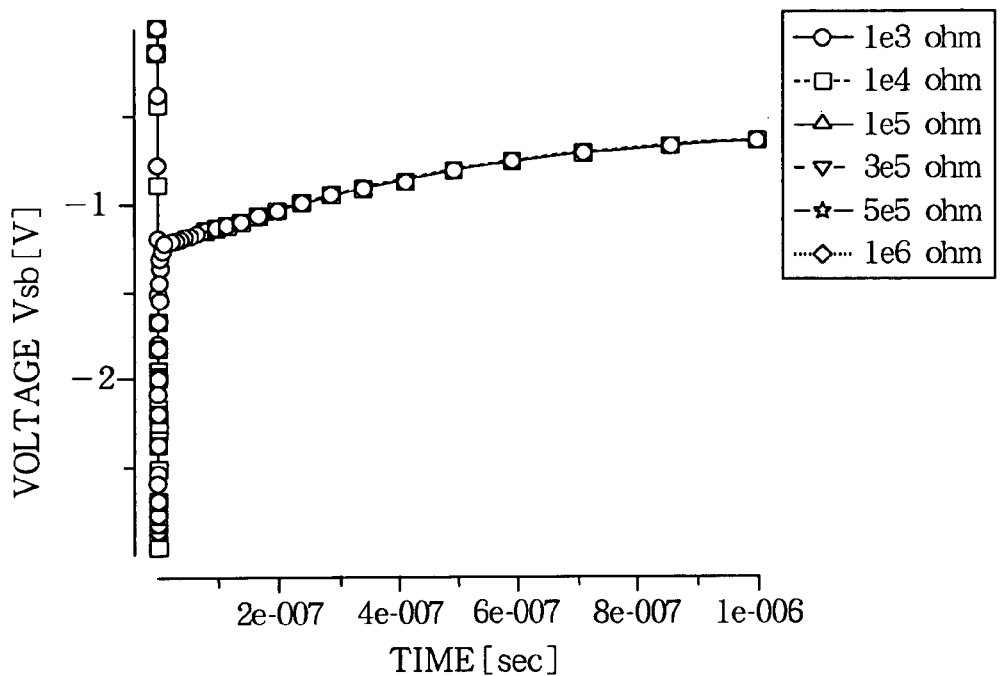
FIG. 32 shows the time varying voltage at a first end of resistor 302 when a negative HBM pulse (−50 V) is applied to the power line LS in the equivalent circuit in FIG. 22.
Figure 33:
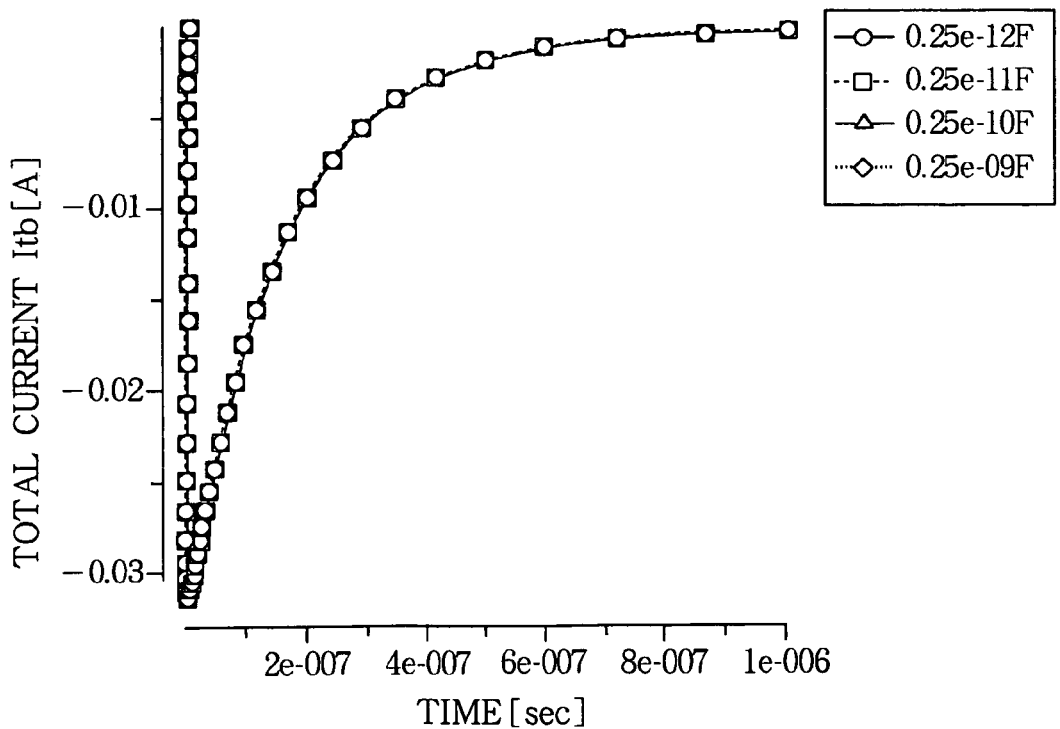
FIG. 33 shows time varying total current when a negative HBM pulse (−50 V) is applied to the power line LS in the equivalent circuit in FIG. 22.
Figure 34:
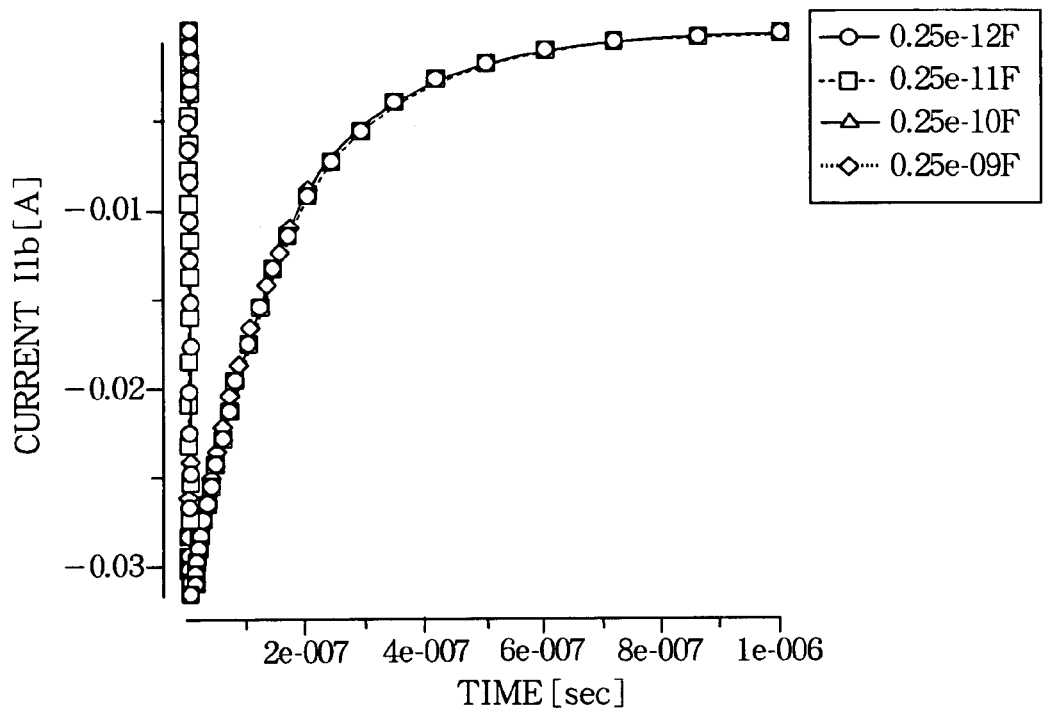
FIG. 34 shows time varying current flowing in PMOSFET 301 when a negative HBM pulse (−50 V) is applied to the power line LS in the equivalent circuit in FIG. 22.
Figure 35:
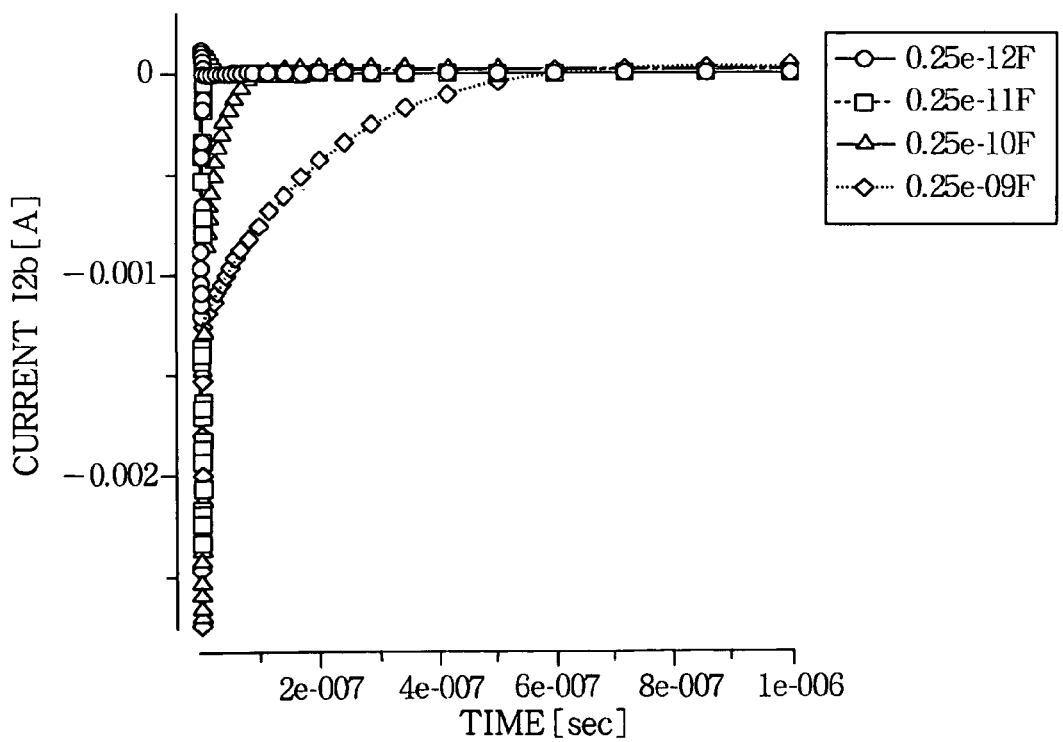
FIG. 35 shows time varying current flowing in resistor 302 when a negative HBM pulse (−50 V) is applied to the power line LS in the equivalent circuit in FIG. 22.
Figure 36:
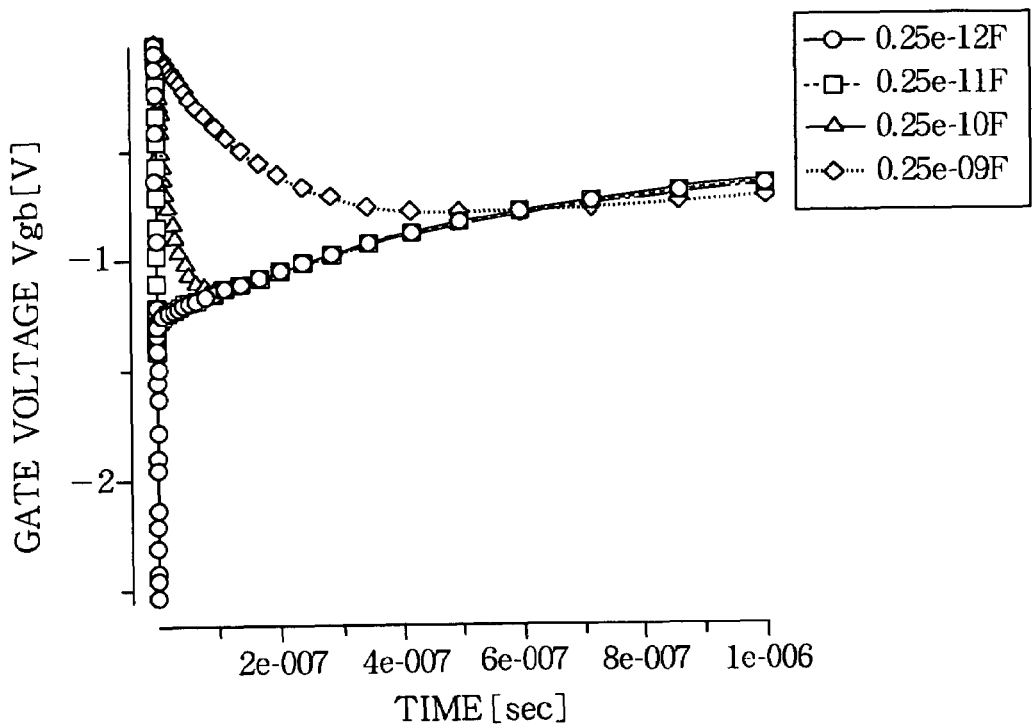
FIG. 36 shows the time varying gate voltage of PMOSFET 301 when a negative HBM pulse (−50 V) is applied to the power line LS in the equivalent circuit in FIG. 22.
Figure 37:
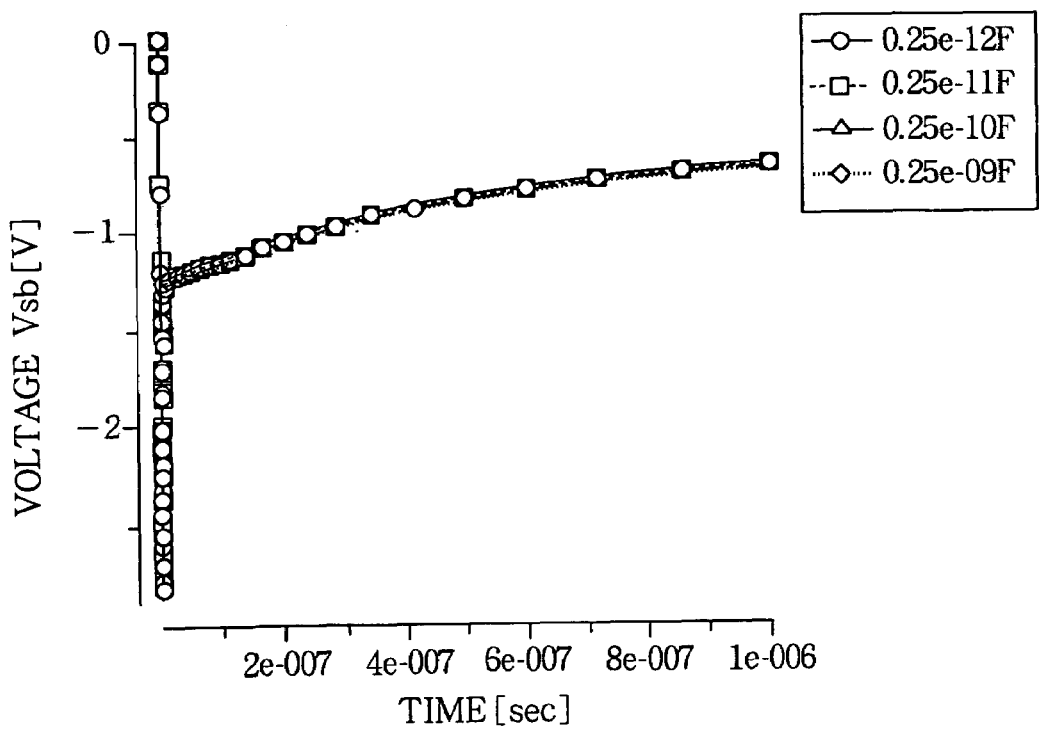
FIG. 37 shows the time varying voltage at the first end of resistor 302 when a negative HBM pulse (−50 V) is applied to the power line LS in the equivalent circuit in FIG. 22.

Among them, FIGS. 28 to 32 show dependencies of these quantities on the value R1 of the resistor 302; FIGS. 33 to 37 show dependencies on the value C1 of the capacitor 303. FIG. 28 and FIG. 33 show the total current Itb flowing from the power line LS shown in FIG. 22 into PMOSFET 301 and the resistor 302. FIGS. 29 and 34 show the current I1b flowing into PMOSFET 31. FIGS. 30 and 35 show the current Ib2 flowing into the resistor 302. FIGS. 31 and 36 show the gate voltage Vgb of PMOSFET 301. FIGS. 32 and 37 show the potential Vsb at the first end of the resistor 302.

It can be seen from FIG. 31 that the gate voltage Vgb of PMOSFET 301 depends on the resistance R1 of the resistor 302. From FIG. 35, it can be seen that the current I2b flowing in the resistor 302 depends on the capacitance value of the capacitor 303, and the gate voltage Vgb of PMOSFET 301 also depends on the capacitance C1 of the capacitor 303. The value R1 of the resistor 302 and the value C1 of the capacitor 303 are accordingly selected so that the value and variation pattern of the gate voltage Vgb of PMOSFET 301 shown in FIG. 31 most closely match the value and variation pattern of the gate voltage Vga of PMOSFET 201 in FIG. 26, and the value and variation pattern of the current IB2 shown in FIG. 35 most closely match the value and variation pattern of the current I2a shown in FIG. 25.

The resistance value R1 and capacitance value C1 of the resistor 302 and capacitor 303 in the equivalent circuit are determined as above.

The resistance and capacitance values of equivalent circuits for the other parts of the internal circuit (for example, the part including NMOSFET 202 and the circuit elements connected to its input side) are determined similarly.

Figure 38:
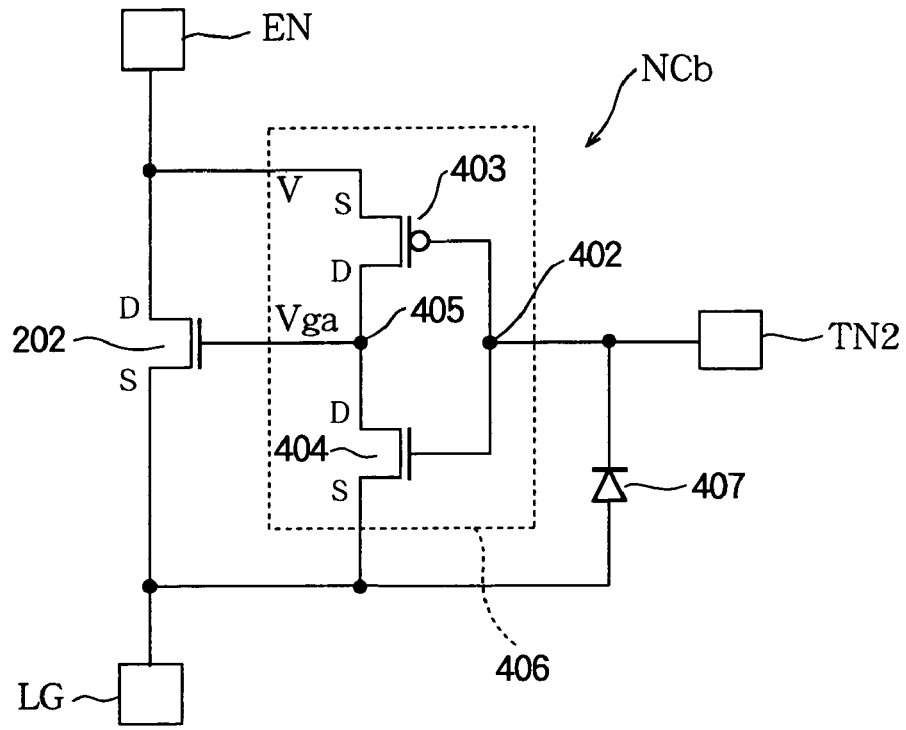
FIG. 38 is a detailed circuit diagram showing an example of a circuit section NCb including NMOSFET 202 in the internal circuit NC in FIG. 14 and its input circuit elements.

FIG. 38 shows an exemplary circuit section NCb including NMOSFET 202 and the circuit elements connected to its input side. In addition to NMOSFET 202, which has its drain connected to node EN and its source connected to the ground line LG, this circuit section NCb also has an inverter 406 having a PMOSFET 403 and an NMOSFET 404, the gates of PMOSFET 403 and NMOSFET 404 being mutually interconnected to form an input terminal 404, the drains of PMOSFET 403 and NMOSFET 404 being interconnected to form an output terminal 405 which is connected to the gate of PMOSFET 202, and a diode 407 having its cathode connected to the input terminal 402 of the inverter 406 and its anode connected to the ground line LG. The input terminal 402 of the inverter 406 is connected to a node TN2.

Figure 39:
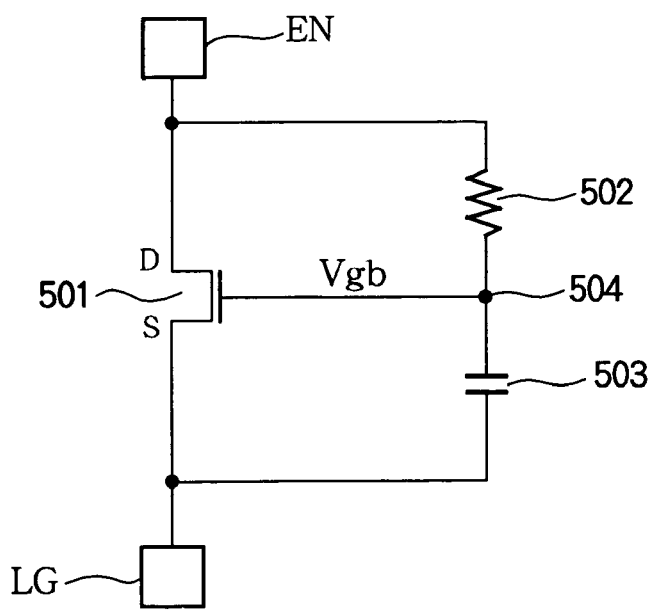
FIG. 39 is a circuit diagram showing the equivalent circuit used in simulation of the circuit in FIG. 38 in the second embodiment.

This sort of circuit section NCb, which forms one part of internal circuit NC (the circuit under simulation), is replaced with the equivalent circuit in FIG. 39. This equivalent circuit comprises one NMOSFET 501, one resistor 502, and one capacitor 503. The resistor 502 is connected in series with the capacitor 503; the first end of the resistor 502 is connected to node EN; the second end of the resistor 502 is connected to a first electrode of the capacitor 503; the second electrode of the capacitor 503 is connected to the ground line LG. The node at which the resistor 502 and capacitor 503 are interconnected is connected to the gate of the NMOSFET 501; the drain and source of the NMOSFET 501 are connected, respectively, to node EN and the ground line LG.

The values of the resistor 502 and capacitor 503 in the equivalent circuit in FIG. 39 are derived as follows. Given that NMOSFET 501 in the equivalent circuit has the same characteristics as NMOSFET 202 in the internal circuit, the values of the resistor 502 and capacitor 503 are selected so that when a surge voltage is applied to the drain of NMOSFET 501, the values and variation patterns of the current flowing through NMOSFET 501, the current flowing through the resistor 502, the voltage at the gate of NMOSFET 501, and the voltage at the first end of the resistor 502 (the end connected to node EN) are substantially the same as the values and variation patterns of the currents and voltages of the corresponding parts in the above internal circuit NCb.

More specifically, the values of the resistor 502 and capacitor 503 are selected so that the values and variation patterns of the current flowing through NMOSFET 501, the current flowing through the resistor 502, the voltage at the gate of NMOSFET 501, and the voltage at the first end of the resistor 502 are substantially the same as the values and variation patterns of the current flowing through NMOSFET 202, the current flowing through the inverter 406, the voltage at the gate of NMOSFET 202, and the voltage at the source of PMOSFET 403 in the inverter 406 in the internal circuit.

The simulation method of the present embodiment can be generalized to include both a circuit section (NCa) including a PMOSFET and the circuit elements connected to its input side and an internal circuit (NCb) including an NMOSFET and the circuit elements connected to its input side as described below. More specifically, in this embodiment, a section of an internal circuit (the circuit under simulation) comprising a first MOSFET (PMOSFET or NMOSFET) having its first main electrode (source or drain) connected to a first node (the power line LS or the external connection node EN (connected, for example, through a resistor Rpoly to a pad PD)) and its second main electrode (drain or source) connected to a second node (node EN or the ground line LG), and the circuit connected to its input side, are replaced with an equivalent circuit including a second MOSFET (PMOSFET or NMOSFET), a resistor with a first end connected to the first main electrode (source or drain) of the second MOSFET and a second end connected to the control electrode (gate electrode) of the second MOSFET, and a capacitor with a first electrode connected to the control electrode of the second MOSFET and a second electrode connected to the second main electrode (drain or source) of the second MOSFET; the values of the resistor and capacitor are selected so that the values and variation patterns of the current flowing through the second MOSFET, the current flowing through the resistor, the voltage applied to the control electrode of the second MOSFET, and the voltage at the first end of the resistor when a surge voltage is applied to the first main electrode of the second MOSFET are substantially the same as the values and variation patterns of the currents and voltages in the corresponding parts of the above circuit section of the circuit under simulation; the equivalent circuit, with a resistor and capacitor having the values thus selected, is then used to perform a simulation of the circuit under simulation.

When the circuit section (NCa or NCb) of the circuit under simulation includes an inverter having a PMOSFET and an NMOSET, the gates of the PMOSFET and an NMOSET being interconnected to form an input terminal, the drains of the PMOSFET and an NMOSET being interconnected to form an output terminal, the values of the resistor and capacitor are selected so that the values and variation patterns of the current flowing through the second MOSFET, the current flowing through the resistor, the voltage applied to the control electrode of the second MOSFET, and the voltage at the first end of the resistor are substantially the same as the values and variation patterns of the current flowing through the first MOSFET, the current flowing through the inverter, the voltage applied to the control electrode of the first MOSFET, and the voltage applied to the source of the PMOSFET in the inverter in the circuit under simulation.

Even if the main electrodes of the MOSFET to which the circuit elements on the input side are connected are connected to nodes other than the power line, the ground line, and the external signal connection node, the simulation can still be performed using a similar equivalent circuit.

In the present embodiment, a simulation of the semiconductor integrated circuit having ESD protection circuits (the entire circuit shown in FIG. 1) is performed with all parts of the internal circuits replaced with equivalent circuits having a circuit configuration similar to the one shown in FIG. 22 or FIG. 39 as described above, (though with different resistor and capacitor values).

The time necessary for simulation can be shortened by performing the simulation in this way, after replacement with equivalent circuits having the simple circuit configuration shown in FIGS. 22 and 39.

What is claimed is:

1. A method of designing an ESD protection circuit, comprising:
   performing a physical analysis, said physical analysis including a measurement of a plurality of physical parameters of a circuit element in the ESD protection circuit and extracting parameters of said circuit element that have a comparatively large impact on ESD protection characteristics, at least one of the extracted parameters being a key parameter; and
   optimizing the at least one key parameter by using said key parameters to perform a mixed-mode device-circuit simulation of the ESD protection circuit.

2. The method of designing an ESD protection circuit recited in claim 1, wherein said measurement includes at least one of measurement of MOSFET breakdown characteristics, photoemission analysis, measurement of impact ionization density, measurement of hole current density, and measurement of electronic current density.

3. A method of simulating a circuit under simulation having MOSFETs connected in multiple stages, comprising:
   replacing a circuit section of the circuit under simulation, including a first MOSFET having a first main electrode connected to a first node and a second main electrode connected to a second node and circuit elements connected to an input side of the first MOSFET, with an equivalent circuit including a second MOSFET, a resistor with a first end connected to the first main electrode of the second MOSFET and a second end connected to the control electrode of the second MOSFET, and a capacitor with a first electrode connected to the control electrode of the second MOSFET and a second electrode connected to the second main electrode of the second MOSFET;
   selecting values of the resistor and the capacitor so that the values and variation patterns of current flowing through the second MOSFET, current flowing through the resistor, voltage applied to the control electrode of the second MOSFET, and voltage at the first end of the resistor, when a surge voltage is applied to the first main electrode of the second MOSFET, are substantially identical to values and variation patterns of voltages and currents in corresponding parts of said circuit section of the circuit under simulation; and
   using the equivalent circuit having the resistor and capacitor with the values thus selected to perform a simulation of the circuit under simulation.

4. The method of simulating recited in claim 3, wherein:
   said section of the circuit under simulation includes an inverter having a PMOSFET and an NMOSFET, gates of the PMOSFET and an NMOSFET being interconnected to form an input terminal, drains of the PMOSFET and an NMOSFET being interconnected to form an output terminal; and
   the values of the resistor and the capacitor are selected so that the values and variation patterns of current flowing through the second MOSFET, current flowing through the resistor, the voltage applied to the control electrode of the second MOSFET, and the voltage at the first end of the resistor are substantially identical to the values and variation patterns of the current flowing through the first MOSFET, the current flowing through the inverter, the voltage applied to the control electrode of the first MOSFET, and the voltage applied to the source of the PMOSFET in the inverter in the circuit under simulation.

5. The method of designing an ESD protection circuit recited in claim 1, further comprising reconfiguring the ESD protection circuit according to results of the mixed-mode device-circuit simulation.

6. The method of designing an ESD protection circuit recited in claim 5, further comprising extracting the key parameters again, using the reconfigured ESD protection circuit.

* * * * *